United States Patent
Hasegawa et al.

(10) Patent No.: US 7,466,525 B2
(45) Date of Patent: Dec. 16, 2008

(54) MAGNETIC SENSING ELEMENT INCLUDING LAMINATED FILM COMPOSED OF HALF-METAL AND NIFE ALLOY AS FREE LAYER

(75) Inventors: Naoya Hasegawa, Niigata-ken (JP); Masamichi Saito, Niigata-ken (JP); Yosuke Ide, Niigata-ken (JP); Masahiko Ishizone, Niigata-ken (JP)

(73) Assignee: TDK Corporation, Tokyo (JP)

( * ) Notice: Subject to any disclaimer, the term of this patent is extended or adjusted under 35 U.S.C. 154(b) by 417 days.

(21) Appl. No.: 11/414,978

(22) Filed: May 1, 2006

(65) Prior Publication Data
US 2006/0250727 A1    Nov. 9, 2006

(51) Int. Cl.
*G11B 5/39* (2006.01)
(52) U.S. Cl. .................................. 360/324.12
(58) Field of Classification Search ............ 360/324.11, 360/324.12, 324.2; 428/692; 365/158
See application file for complete search history.

(56) References Cited

U.S. PATENT DOCUMENTS

| | | | | |
|---|---|---|---|---|
| 6,868,002 | B2 * | 3/2005 | Saito et al. | 365/158 |
| 6,876,522 | B2 * | 4/2005 | Ambrose et al. | 360/324.11 |
| 6,977,801 | B2 * | 12/2005 | Carey et al. | 360/324.11 |
| 6,995,961 | B2 * | 2/2006 | Hasegawa et al. | 360/324.12 |
| 7,035,062 | B1 * | 4/2006 | Mao et al. | 360/324.2 |
| 2002/0058158 | A1 * | 5/2002 | Odagawa et al. | 428/692 |
| 2003/0011463 | A1 | 1/2003 | Iwasaki et al. | |
| 2003/0137785 | A1 | 7/2003 | Saito | |
| 2004/0041679 | A1 | 3/2004 | Saito et al. | |
| 2004/0218311 | A1 | 11/2004 | Saito et al. | |
| 2006/0050446 | A1 | 3/2006 | Ishizone et al. | |

FOREIGN PATENT DOCUMENTS

| | | |
|---|---|---|
| JP | 60-251682 | 12/1985 |
| JP | 8-504303 | 5/1996 |
| JP | 2002-190630 | 7/2002 |
| JP | 2003-8103 | 1/2003 |
| JP | 2003-218428 | 7/2003 |
| JP | 2003-298148 | 10/2003 |
| JP | 2004-95583 | 3/2004 |
| JP | 2004-95584 | 3/2004 |
| JP | 2004-95585 | 3/2004 |
| JP | 2004-95587 | 3/2004 |
| WO | WO 95/10123 | 4/1995 |

* cited by examiner

*Primary Examiner*—Tianjie Chen
(74) *Attorney, Agent, or Firm*—Brinks Hofer Gilson & Lione

(57) ABSTRACT

A magnetic sensing element exhibiting a large ΔRA is provided, in which a free magnetic layer has a small coercive force Hc and a small magnetostriction constant λs. The free magnetic layer includes a $Co_2MnZ$ alloy layer (where Z may represent at least one element selected from the group consisting of Al, Sn, In, Sb, Ga, Si, Ge, Pb, and Zn) and a $(Ni_aFe_{100-a})_bX_{100-b}$ alloy layer (where X may represent at least one element selected from the group consisting of Cu, Au, Ag, Zn, Mn, Al, Cd, Zr, and Hf, a may represent a composition ratio satisfying $80 < a \leq 100$, and b may represent a composition ratio satisfying $60 < b \leq 100$). Consequently, the magnetostriction constant λs and the coercive force Hc of the free magnetic layer may be decreased and the soft magnetic properties of the free magnetic layer may be improved.

19 Claims, 10 Drawing Sheets

MAGNETIC SENSING ELEMENT INCLUDING LAMINATED FILM COMPOSED OF HALF-METAL AND NIFE ALLOY AS FREE LAYER

This application claims the benefit of priority to Japanese Application No. 2004-256517, filed Sep. 3, 2004, and to Japanese Application No. 2005-035570, filed Feb. 14, 2005, which are incorporated herein by reference.

TECHNICAL FIELD

The present invention relates to a current-perpendicular to-the-plane (CPP) magnetic sensing element in which a sensing current flows in a direction perpendicular to the film surface. In particular, the present invention relates to a magnetic sensing element capable of increasing the product $\Delta RA$ of resistance variation $\Delta R$ and element area A.

BACKGROUND

FIG. 10 is a partial sectional view of a known magnetic sensing element (spin valve type thin film element) cut along a direction parallel to a surface facing a recording medium.

In FIG. 10, reference numeral 1 denotes a substrate layer made of Ta. A seed layer 2 made of a metal, e.g., Cr, having a body-centered cubic structure (bcc structure) is disposed on the substrate layer 1.

A multilayer film T, in which an antiferromagnetic layer 3, a pinned magnetic layer 4, a non-magnetic material layer 5, a free magnetic layer 6, and a protective layer 7 are deposited sequentially, is disposed on the seed layer 2.

The protective layer 7 is formed from Ta, the non-magnetic material layer 5 is formed from Cu, the free magnetic layer 6 and the pinned magnetic layer 4 are formed from a Heusler alloy, e.g., $Co_2MnGe$, and the antiferromagnetic layer 3 is formed from PtMn.

Electrode layers 10 and 10 are disposed on the top and the bottom of the multilayer film T, and a direct current serving as a sensing current flows in a direction perpendicular to the film surfaces of the multilayer film.

An exchange coupling magnetic field is generated at the interface between the antiferromagnetic layer 3 and the pinned magnetic layer 4, and the magnetization of the pinned magnetic layer 4 is pinned in the height direction (Y direction shown in the drawing).

Hard bias layers 8 made of a hard magnetic material, e.g., CoPt, are disposed on both sides of the free magnetic layer 6, and the top, bottom, and end portions of the hard bias layers 8 are insulated by insulating layers 9. The magnetization of the free magnetic layer 6 is aligned in a track-width direction (X direction shown in the drawing) by longitudinal bias magnetic fields from the hard bias layers 8.

When an external magnetic field is applied to the magnetic sensing element shown in FIG. 10, the magnetization direction of the free magnetic layer is varied relative to the magnetization direction of the pinned magnetic layer, and the resistance of the multilayer film is changed. In the case where a sensing current flows at a constant current value, this change in resistance is detected as a change in voltage, so that the external magnetic field may be detected.

The magnetic sensing element including the free magnetic layer made of a Heusler alloy is described in Japanese Unexamined Patent Application Publication No. 2003-218428.

It is described in Japanese Unexamined Patent Application Publication No. 2003-218428 that the free magnetic layer is made of a Heusler alloy, e.g., a CoMnGe alloy. A configuration in which a NiFe layer is deposited on the CoMnGe alloy is also described.

However, it has been found that a suitable free magnetic layer cannot be formed simply by depositing the NiFe layer on the layer made of a Heusler alloy.

SUMMARY OF THE INVENTION

A magnetic sensing element having a free magnetic layer in a suitable configuration is described. The magnetic sensing element includes a multilayer film having a pinned magnetic layer, in which the direction of magnetization is pinned in one direction, and a free magnetic layer disposed on the pinned magnetic layer with a non-magnetic material layer therebetween. The free magnetic layer includes a laminate of a $Co_2MnZ$ alloy layer (where Z may represent at least one element selected from the group consisting of Al, Sn, In, Sb, Ga, Si, Ge, Pb, and Zn) and a $(Ni_aFe_{100-a})_bX_{100-b}$ alloy layer (where X may represent at least one element selected from the group consisting of Cu, Au, Ag, Zn, Mn, Al, Cd, Zr, and Hf, a may represent a composition ratio satisfying $80<a\leq100$, and b may represent a composition ratio satisfying $60<b\leq100$). The composition ratio a represents a content of Ni in NiFe on an atomic percent basis, and the composition ratio b represents a content of NiFe in the $(Ni_aFe_{100-a})_bX_{100-b}$ alloy on an atomic percent basis.

If the composition ratio of the $(Ni_aFe_{100-a})_bX_{100-b}$ alloy layer to be laminated on the $Co_2MnZ$ alloy layer is specified as described above, the properties of the free magnetic layer may be improved.

The free magnetic layer may have a three-layer structure in which the $(Ni_aFe_{100-a})_bX_{100-b}$ alloy layer is interposed between the two $Co_2MnZ$ alloy layers (where Z may represent at least one element selected from the group consisting of Al, Sn, In, Sb, Ga, Si, Ge, Pb, and Zn) disposed facing each other in a vertical direction.

The product $\Delta RA$ of resistance variation and element area may be increased by the configuration described above.

In this case, when the $(Ni_aFe_{100-a})_bX_{100-b}$ alloy layer has a film thickness of 10 angstroms or more and 60 angstroms or less, the soft magnetic properties of the free magnetic layer may be improved and the product $\Delta RA$ of resistance variation and element area of the magnetic sensing element may be increased effectively.

DETAILED DESCRIPTION

Figure 1:
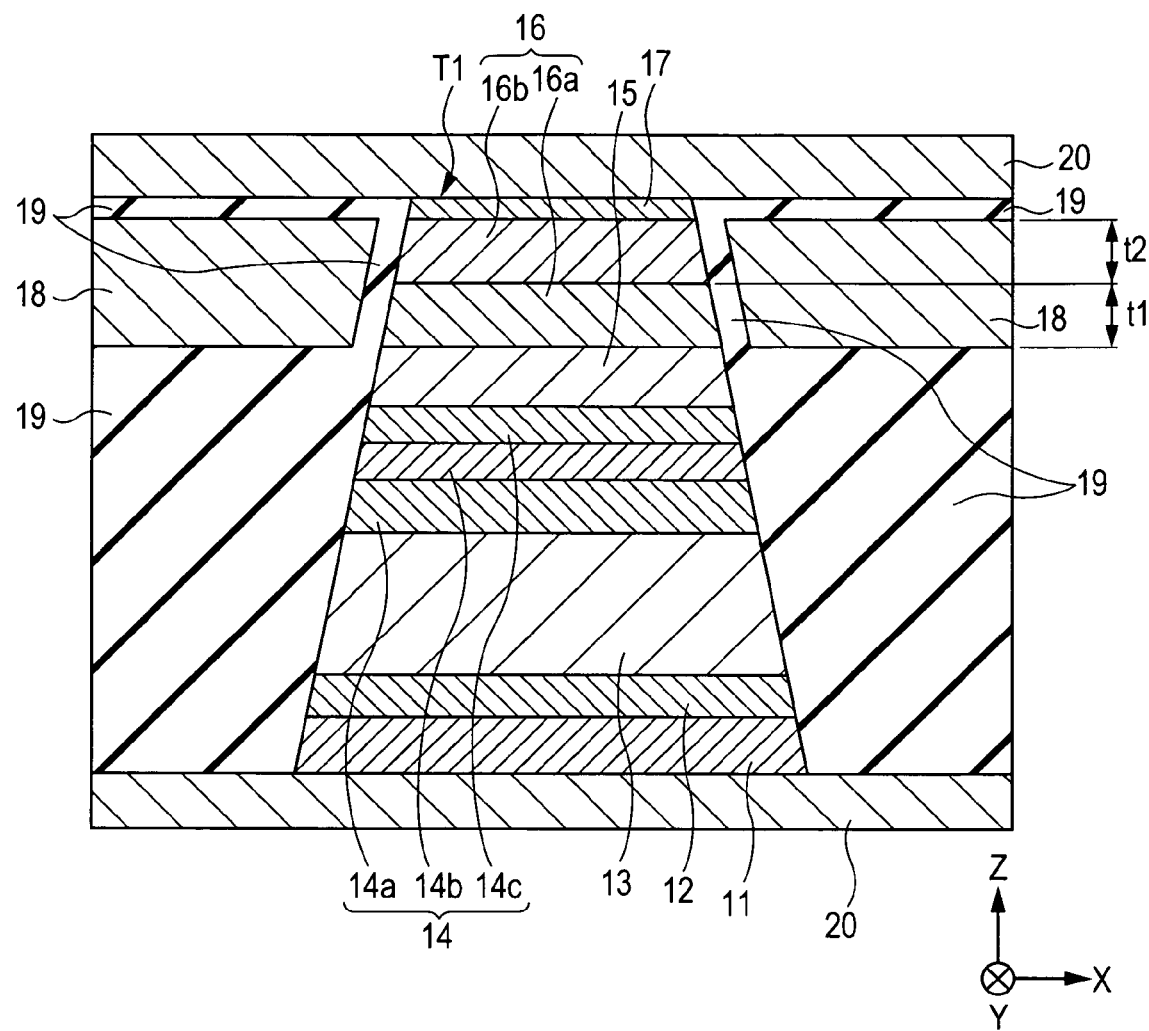
FIG. 1 is a sectional view of the structure of a magnetic sensing element (single spin valve type magnetoresistance effect element) according to a first embodiment viewed from a surface facing a recording medium.

FIG. 1 is a sectional view of the entire structure of a magnetic sensing element (single spin valve type magnetoresistance effect element) according to the first embodiment viewed from a surface facing a recording medium. FIG. 1 shows a cross-sectional view of only the central portion of the element extending in the X direction.

This single spin valve type magnetoresistance effect element is disposed at the trailing side end portion and the like of a flying slider disposed in a hard disk device, and is to detect a recording magnetic field of the hard disk and the like. The movement direction of the magnetic recording medium, e.g., a hard disk, is the Z direction, and the direction of the leakage magnetic field from the magnetic recording medium is the Y direction.

In FIG. 1, the lowermost portion is a substrate layer 11 formed from a non-magnetic material, e.g., at least one element selected from the group consisting of Ta, Hf, Nb, Zr, Ti, Mo, and W. A multilayer film T1 composed of a seed layer 12, an antiferromagnetic layer 13, a pinned magnetic layer 14, a non-magnetic material layer 15, a free magnetic layer 16, and a protective layer 17 is disposed on this substrate layer 11. The magnetic sensing element shown in FIG. 1 is a so-called bottom spin valve type GMR magnetic sensing element in which the antiferromagnetic layer 13 is disposed under the free magnetic layer 16.

The seed layer 12 may be formed from NiFeCr or Cr. When the seed layer 12 is formed from NiFeCr, the seed layer 12 may have a face-centered cubic (fcc) structure, in which equivalent crystal planes represented by the {111} family of planes are preferentially oriented in a direction parallel to the film surface. When the seed layer 12 is formed from Cr, the seed layer 12 may have a body-centered cubic (bcc) structure, in which equivalent crystal planes represented by the {110} family of planes are preferentially oriented in a direction parallel to the film surface.

The substrate layer 11 may have an amorphous-like structure. The substrate layer 11 may not be formed.

The antiferromagnetic layer 13 disposed on the seed layer 12 may be formed from an antiferromagnetic material containing an element X (where X is at least one element selected from the group consisting of Pt, Pd, Ir, Rh, Ru, and Os) and Mn.

The antiferromagnetic layer 13 may have a face-centered cubic (fcc) structure or a face-centered tetragonal (fct) structure.

These X—Mn alloys including platinum group elements may have properties suitable for antiferromagnetic materials; for example, they may exhibit excellent corrosion resistance and a high blocking temperature. Furthermore, it may be possible to attain a large exchange coupling magnetic field (Hex) using these alloys. A PtMn alloy or an IrMn alloy formed in a binary system may be used, for example.

The antiferromagnetic layer 13 may be formed, for example, from an antiferromagnetic material containing an element X, an element X' (where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements), and Mn.

The atoms of element X' may enter the interstices of the space lattice constituted of X atoms and Mn atoms and/or may be substituted for some of the atoms at the lattice points. Here, a solid solution refers to a solid in which components are homogeneously mixed over a wide range.

A preferable composition range of the element X' may be from about 0.2 to about 10 atomic percent, and more preferably from about 0.5 to about 5 atomic percent. Element X may be Pt or Ir.

The content of the element X or the elements X+X' in the antiferromagnetic layer 13 may be specified to be about 45 atomic percent or more and about 60 atomic percent or less. More preferably, the content may be about 49 atomic percent or more and about 56.5 atomic percent or less. It is hypothesized that the interface of the pinned magnetic layer 14 may be brought thereby into a noncoherent state in the film formation stage, and furthermore, that the antiferromagnetic layer 13 may undergo an appropriate ordering transformation upon heat treatment.

The pinned magnetic layer 14 disposed on the antiferromagnetic layer 13 may have a three-layer structure. The three-layer structure may include a magnetic layer 14a, a non-magnetic intermediate layer 14b, and a magnetic layer 14c. The magnetization directions of the magnetic layer 14a and the magnetic layer 14c may be aligned antiparallel to each other by an exchange coupling magnetic field at the interface between the antiferromagnetic layer 13 and the pinned magnetic layer 14, and by an antiferromagnetic exchange coupling magnetic field (RKKY interaction) through the non-magnetic intermediate layer 14b. This may be referred to as a so-called artificial ferrimagnetic coupling state. By this configuration, the magnetization of the pinned magnetic layer 14 may be stabilized, and the exchange coupling magnetic field generated at the interface between the pinned magnetic layer 14 and the antiferromagnetic layer 13 may increase.

Alternatively, the pinned magnetic layer 14 may be formed to have a single-layer structure of the magnetic material layer or a multilayer structure of magnetic material layers.

For example, the magnetic layer 14a may be formed to measure from about 15 to about 35 angstroms, the non-magnetic intermediate layer 14b may be formed to measure from about 8 to about 10 angstroms, and the magnetic layer 14c may be formed to measure from about 20 to about 50 angstroms.

The non-magnetic intermediate layer 14b may be formed from a non-magnetic electrically conductive material, e.g., Ru, Rh, Ir, Cr, Re, or Cu.

Preferably, the magnetic layer 14c of the pinned magnetic layer 14 may be a $Co_2YZ$ alloy layer (where Y may represent at least one element selected from the group consisting of Mn, Fe, and Cr, and Z may represent at least one element selected from the group consisting of Al, Ga, Si, Ge, Sn, In, Sb, Pb, and Zn). The $Co_2YZ$ alloy layer has half-metallic properties, and may be effective at increasing the product ΔRA of resistance variation ΔR and element area A of the CPP-GMR magnetic sensing element.

The non-magnetic material layer 15 disposed on the pinned magnetic layer 14 may be formed from Cu, Au, or Ag.

The free magnetic layer 16 may be further disposed on the nonmagnetic material layer 15. The configuration of the free magnetic layer 16 will be described later.

In the embodiment shown in FIG. 1, hard bias layers 18 and 18 are disposed on both sides of the free magnetic layer 16. The magnetization of the free magnetic layer 16 may be aligned in a track-width direction (X direction shown in the drawing) by longitudinal bias magnetic fields from the hard bias layers 18 and 18. The hard bias layers 18 and 18 may be formed from, for example, a cobalt-platinum (Co—Pt) alloy or a cobalt-chromium-platinum (Co—Cr—Pt) alloy.

The top, bottom, and end portions of the hard bias layers 18 and 18 may be insulated by insulating layers 19 and 19 made of alumina or the like.

Electrode layers 20 and 20 are disposed on the top and bottom of the multilayer film T1, so that a current-perpendicular-to-the-plane (CPP)-GMR magnetic sensing element may be constructed, in which a sensing current flows in a direction perpendicular to the film surface of each layer constituting the multilayer film T1.

The electrode layers 20 and 20 may be formed from α-Ta, Au, Cr, Cu (copper), Rh, Ir, Ru, W (tungsten), or the like.

Major features of the present embodiment will be described.

The free magnetic layer 16 may be a laminate of a $Co_2MnZ$ alloy layer 16a (where Z may represent at least one element selected from the group consisting of Al, Sn, In, Sb, Ga, Si, Ge, Pb, and Zn) and a $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying 80<a≦100, and b may represent a composition ratio satisfying 60<b≦100.

The composition ratio a represents a content of Ni in NiFe on an atomic percent basis, and the composition ratio b represents a content of NiFe in a $(Ni_aFe_{100-a})_bX_{100-b}$ alloy on an atomic percent basis.

The composition ratio of the $(Ni_aFe_{100-a})_bX_{100-b}$ alloy layer 16b to be deposited on the $Co_2MnZ$ alloy layer 16a may be specified as described above and, thereby, the magnetostriction constant λs of the $(Ni_aFe_{100-a})_bX_{100-b}$ alloy layer 16b may be made negative, so that the magnetostriction constant λs and the coercive force Hc of the free magnetic layer 16 may be reduced, and the soft magnetic properties of the free magnetic layer may be improved.

In particular, it may be preferable that the ratios a and b of the $(Ni_aFe_{100-a})_bX_{100-b}$ alloy layer 16b satisfy 80<a≦100 and 90<b≦100, respectively.

When the element X is added to the NiFe alloy, the spin-dependent bulk scattering coefficient β of the $(Ni_aFe_{100-a})_bX_{100-b}$ alloy may be increased, and ΔRA of the magnetic sensing element may be increased.

When the element X is added to the NiFe alloy, the magnetic thickness (product Mst of saturation magnetization Ms and film thickness) of the $(Ni_aFe_{100-a})_bX_{100-b}$ alloy layer may be decreased, and the fluctuation of the free magnetic layer 16 in response to an external magnetic field may be increased. That is, the detection sensitivity of the magnetic sensing element to a magnetic field may be improved.

The film thickness t2 of the $(Ni_aFe_{100-a})_bX_{100-b}$ alloy layer 16b may be about 10 angstroms or more and about 60 angstroms or less. If the film thickness t2 of the $(Ni_aFe_{100-a})_bX_{100-b}$ alloy layer 16b exceeds about 60 angstroms, the product ΔRA of resistance variation ΔR and element area A may be decreased. If the film thickness t2 is less than about 10 angstroms, the magnetostriction of the entire free magnetic layer 16 may be increased. These may not be preferable.

The film thickness t1 of the $Co_2MnZ$ alloy layer 16a may be about 40 angstroms or more and about 80 angstroms or less. When the film thickness of the $Co_2MnZ$ alloy layer 16a is about 40 angstroms or more, the crystallinity and the periodicity of the $Co_2MnZ$ alloy layer 16a may be improved.

When the $Co_2MnZ$ alloy layer 16a is in contact with the non-magnetic material layer 15, as in the present embodiment, the ΔRA of the magnetic sensing element may be improved as compared with that in the case where the $(Ni_aFe_{100-a})_bX_{100-b}$ alloy layer 16b is in contact with the non-magnetic material layer 15.

As for the spin valve type thin film element shown in FIG. 1, the substrate layer 11 to the protective layer 17 are deposited and, thereafter, a heat treatment may be performed, so that an exchange coupling magnetic field may be generated at the interface between the antiferromagnetic layer 13 and the pinned magnetic layer 14. At this time, the magnetic field may be aligned in a direction parallel to the Y direction shown in the drawing and, thereby, the magnetization of the pinned magnetic layer 14 may be aligned and pinned in a direction parallel to the Y direction shown in the drawing. In the embodiment shown in FIG. 1, since the pinned magnetic layer 14 has an artificial ferrimagnetic structure, when the magnetic layer 14a is magnetized in, for example, the Y direction shown in the drawing, the magnetic layer 14c is magnetized in the direction opposite or antiparallel to the Y direction shown in the drawing.

Furthermore, the $Co_2MnZ$ alloy layer 16a of the free magnetic layer 16 may have a superlattice structure due to the heat treatment.

As for the magnetic sensing element shown in FIG. 1, the magnetization of the pinned magnetic layer and the magnetization of the free magnetic layer may be orthogonal to each other. When a leakage magnetic field from a recording medium enters the magnetic sensing element in the Y direction shown in the drawing, the magnetization of the free magnetic layer fluctuates with high sensitivity and the electrical resistance varies depending on the relationship between the magnetization direction of the free magnetic layer and that of the pinned magnetic layer. The leakage magnetic field from the recording medium may be detected based on the change in voltage or the change in current resulting from the change in electrical resistance.

The $Co_2MnZ$ alloy constituting the $Co_2MnZ$ alloy layer 16a of the free magnetic layer 16 is a Heusler alloy. The Heusler alloy is a general name of metal compounds having a Heusler type of crystal structure that may exhibit ferromagnetism depending on the composition. The $Co_2MnZ$ alloy may have a large spin polarizability and exhibit half-metallic behavior in which the majority of the conduction electrons are either up-spin electrons or down-spin electrons.

When the free magnetic layer 16 of the CPP-GMR magnetic sensing element includes a $Co_2MnZ$ alloy layer 16a, the magnitude of the change in spin scattering length or mean free path of conduction electrons within the free magnetic layer 16 may be increased upon application of an external magnetic field. That is, the variation in resistance of the multilayer film may be increased, and the detection sensitivity to an external magnetic field may be improved.

However, if the free magnetic layer 16 is made to have a single layer structure of the $Co_2MnZ$ alloy layer 16a, the magnetostriction constant λs and the coercive force Hc of the free magnetic layer 16 may be increased, and the stability of the detection sensitivity to a magnetic field may be reduced.

Here, the magnetostriction constant λs and the coercive force Hc of the free magnetic layer 16 may be reduced by depositing the $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying $80<a\leq100$, and b may represent a composition ratio satisfying $60<b\leq100$) on the $Co_2MnZ$ alloy layer 16a, as in the present embodiment. This is because the magnetostriction constant λs of the $(Ni_aFe_{100-a})_bX_{100-b}$ alloy may be made negative and the coercive force Hc may be reduced when the composition ratios of the element Ni, the element Fe, and the element X in the $(Ni_aFe_{100-a})_bX_{100-b}$ alloy are set within the ranges described above.

The $Co_2MnZ$ alloy layer 16a made of a Heusler alloy is deposited on the non-magnetic material layer 15, which may be made of Cu.

The non-magnetic material layer 15 may have a face-centered cubic (fcc) structure, so that equivalent crystal planes represented by the {111} family of planes are preferentially oriented in a direction parallel to the film surface.

The (111) plane of the face-centered cubic (fcc) structure is a close-packed plane. Since this close-packed plane is exposed at the surface of the non-magnetic material layer 15, atoms of the free magnetic layer (Heusler alloy layer) deposited on the non-magnetic material layer 15 may be prevented from diffusing into the non-magnetic material layer 15.

After film deposition, the free magnetic layer 16 made of the Heusler alloy may be treated to form a superlattice structure such that each atom is located at a specific site of the crystal lattice. When the free magnetic layer 16 is formed on a close-packed plane of the non-magnetic material layer 15, atoms of the Heusler alloy tend to move in a direction parallel to the film surface, and the interchange of atoms required to form the superlattice may be readily achieved.

Likewise, in the case where a heat treatment is performed to accelerate the formation of the superlattice after film deposition, the interfacial diffusion between the free magnetic layer 16 and the non-magnetic material layer 15 may be minimized.

The $Co_2MnZ$ alloy layer 16a may have a body-centered cubic (bcc) structure, with equivalent crystal planes represented by the (220) plane preferentially oriented in a direction parallel to the film surface.

The (220) plane of the body-centered cubic (bcc) structure is a close-packed plane. Therefore, interdiffusion between atoms of the free magnetic layer 16 and atoms of the non-magnetic material layer 15 in the vicinity of the interface between the free magnetic layer 16 and the non-magnetic material layer 15 may be prevented. The interchange of atoms required to form a superlattice may be readily achieved.

The free magnetic layer 16 may have an artificial ferrimagnetic structure including, for example, a non-magnetic intermediate layer made of Ru or the like and other magnetic layers on the laminate of the $Co_2MnZ$ alloy layer 16a and the $(Ni_aFe_{100-a})_bX_{100-b}$ alloy layer 16b.

Figure 2:
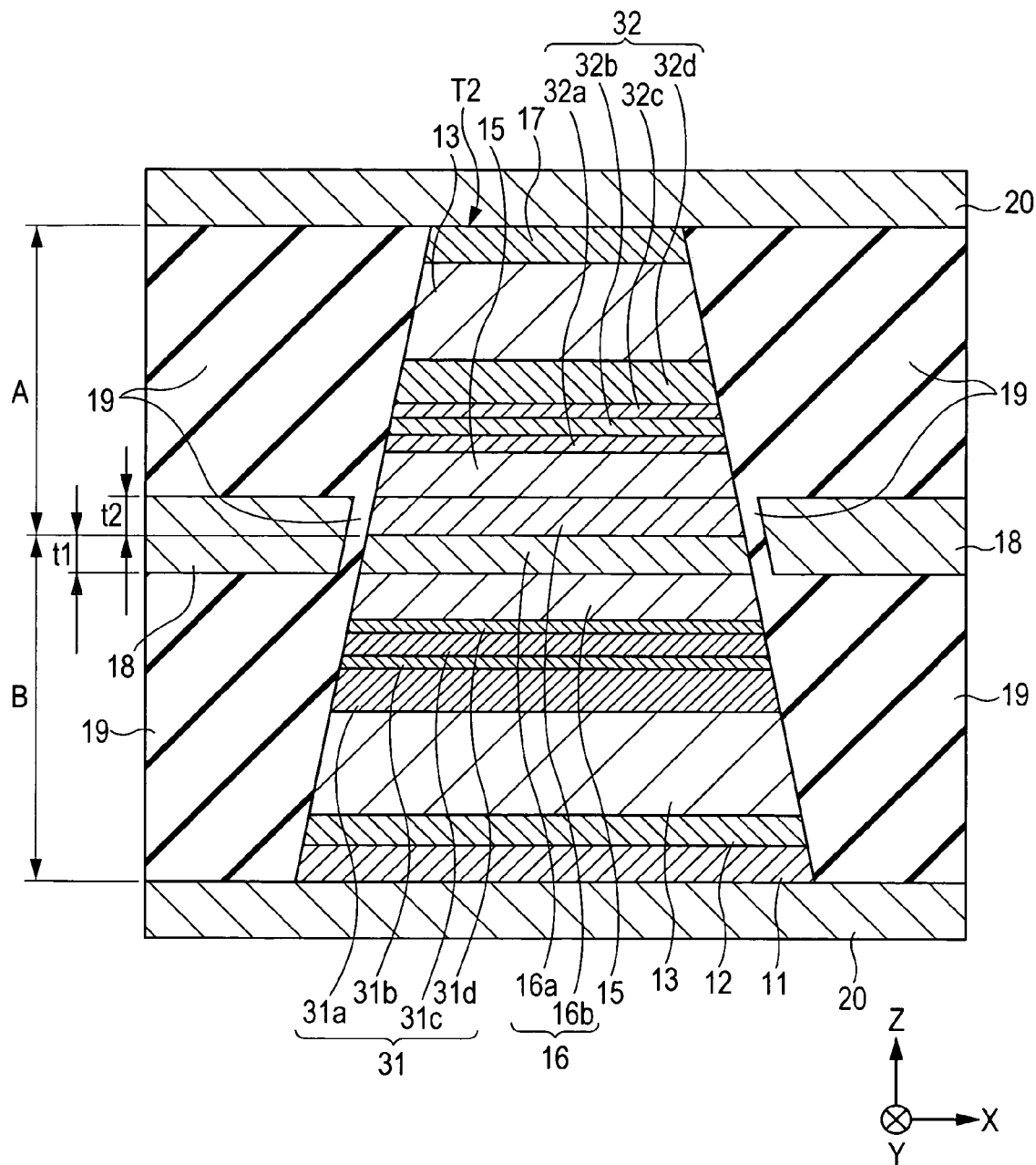
FIG. 2 is a sectional view of the structure of a magnetic sensing element (dual spin valve type magnetoresistance effect element) according to a second embodiment viewed from a surface facing a recording medium.

FIG. 2 is a partial sectional view showing the structure of a dual spin valve type magnetic sensing element.

As shown in FIG. 2, a substrate layer 11, a seed layer 12, an antiferromagnetic layer 13, a pinned magnetic layer 31, a non-magnetic material layer 15, and a free magnetic layer 16 are sequentially deposited from the bottom. Furthermore, a non-magnetic material layer 15, a pinned magnetic layer 32, an antiferromagnetic layer 13, and a protective layer 17 are sequentially deposited on the free magnetic layer 16, so that a multilayer film T2 is disposed.

Hard bias layers 18 and 18 are formed on both sides of the free magnetic layer 16. The hard bias layers 18 and 18 may be insulated by insulating layers 19 and 19 made of alumina or the like.

Electrode layers 20 and 20 may be disposed on the top and bottom of the multilayer film T2, so that a current-perpendicular-to-the-plane (CPP)-GMR magnetic sensing element may be constructed, in which a sensing current flows in a direction perpendicular to the film surface of each layer constituting the multilayer film T2.

In FIG. 2, the layers indicated by the same reference numerals as those in FIG. 1 may be formed from the same materials as the materials for the layers shown in FIG. 1.

The pinned magnetic layer 31 of the magnetic sensing element shown in FIG. 2 has a four-layer structure composed of a magnetic layer 31a, a non-magnetic intermediate layer 31b, a magnetic layer 31c, and a Heusler alloy layer 31d. The magnetic layer 31a and the magnetic layer 31c may be formed from a ferromagnetic material, e.g., CoFe, and the Heusler alloy layer 31d may be formed from a Heusler alloy described below. The Heusler alloy layer 31d may exhibit ferromagnetism, and the magnetization of the magnetic layer 31c and the magnetization of the Heusler alloy layer 31d may be aligned in the same direction by a ferromagnetic coupling.

The magnetization direction of the magnetic layer 31a may be aligned antiparallel to the magnetization directions of the magnetic layer 31c and the Heusler alloy layer 31d by the exchange coupling magnetic field at the interface between the antiferromagnetic layer 13 and the pinned magnetic layer 31 and by the antiferromagnetic exchange coupling magnetic field (RKKY interaction) through the non-magnetic intermediate layer 31b.

When the Heusler alloy layer 31d is disposed in the pinned magnetic layer 31 of the CPP-GMR magnetic sensing element and the Heusler alloy layer 32a is disposed in the pinned magnetic layer 32, the magnitude of the change in spin scattering length or mean free path of conduction electrons within the multilayer film T2 upon application of an external magnetic field may be increased. That is, the magnitude of the change in the resistance of the multilayer film T2 may be increased, and the detection sensitivity to an external magnetic field may be improved. A Heusler alloy layer may be deposited under the non-magnetic intermediate layer 31b or on the non-magnetic intermediate layer 32c. However, since a layer in contact with the non-magnetic material layer 15 may contribute to the magnetoresistive effect, it may be more effective to deposit the Heusler alloy layer directly on the non-magnetic intermediate layer 31b or directly under the non-magnetic intermediate layer 32c.

The Heusler alloy layer 31d is one layer of the pinned magnetic layer 31, and may be a $Co_2YZ$ alloy layer (where Y may represent at least one element selected from the group consisting of Mn, Fe, and Cr, and Z may represent at least one element selected from the group consisting of Al, Ga, Si, Ge, Sn, In, Sb, Pb, and Zn). The $Co_2YZ$ alloy layer may exhibit half-metallic behavior, and may be effective at increasing the product ΔRA of resistance variation ΔR and element area A of the CPP-GMR magnetic sensing element.

The Heusler alloy layer 31d may be formed from a metal compound represented by a compositional formula, $Co_2MnZ$, where Z may represent at least one element selected from the group consisting of Al, Ga, Si, Ge, Sn, In, Sb, Pb, and Zn.

Alternatively, the Heusler alloy layer 31d may be formed by using a $(Co_{0.67}Fe_{0.33})_{100-a}Z_a$ alloy (where Z may represent at least one element selected from the group consisting of Al, Ga, Si, and Ge, and a may satisfy $0 < a \leq 30$ on an atomic percent basis). Preferably, a in the $(Co_{0.67}Fe_{0.33})_{100-a}Z_a$ alloy layer may be within the range of $7 \leq a \leq 30$ on an atomic percent basis, and more preferably, a may be within the range of $22 \leq a \leq 28$. Z in the $(Co_{0.67}Fe_{0.33})_{100-a}Z_a$ alloy may represent, for example, at least one of Al and Ga. Alternatively, Z in the $(Co_{0.67}Fe_{0.33})_{100-a}Z_a$ alloy may represent, for example, Al.

Since the $(Co_{0.67}Fe_{0.33})_{100-a}Z_a$ alloy exhibits half-metallic behavior, the ΔRA of the magnetic sensing element may be increased. Since the magnetostriction of the $(Co_{0.67}Fe_{0.33})_{100-a} Z_a$ alloy may be larger than those of a CoMnGe alloy and a CoMnGa alloy, the uniaxial anisotropy of the pinned magnetic layer 31 may be enhanced when the $(Co_{0.67}Fe_{0.33})_{100-a} Z_a$ alloy is used as a material for a layer constituting the pinned magnetic layer 31.

The pinned magnetic layer 32 of the magnetic sensing element shown in FIG. 2 has a four-layer structure composed of a Heusler alloy layer 32a, a magnetic layer 32b, a non-magnetic intermediate layer 32c, and a magnetic layer 32d. The magnetic layer 32b and the magnetic layer 32d may be formed from a ferromagnetic material, e.g., CoFe, and the Heusler alloy layer 32a may be formed from the same Heusler alloy as the Heusler alloy constituting the Heusler alloy layer 31d of the pinned magnetic layer 31. The magnetic layer 32b may exhibit ferromagnetism, and the magnetization of the Heusler alloy layer 32a and the magnetization of the magnetic layer 32b may be aligned in the same direction by a ferromagnetic coupling.

The magnetization direction of the magnetic layer 32d and the magnetization directions of the Heusler alloy layer 32a and the magnetic layer 32b may be aligned antiparallel to each other by an exchange coupling magnetic field at the interface between the antiferromagnetic layer 13 and the pinned magnetic layer 32 and by the antiferromagnetic exchange coupling magnetic field (RKKY interaction) through the non-magnetic intermediate layer 32c.

The pinned magnetic layer 31 and the pinned magnetic layer 32 may be formed without an artificial ferrimagnetic structure. The pinned magnetic layer 31 shown in FIG. 2 may be used, for example, in place of the pinned magnetic layer 14 of the magnetic sensing element shown in FIG. 1.

In the present embodiment as well, the free magnetic layer 16 includes a $Co_2MnZ$ alloy layer 16a (where Z may represent at least one element selected from the group consisting of Al, Sn, In, Sb, Ga, Si, Ge, Pb, and Zn) and a $(Ni_aFe_{100-a})_b X_{100-b}$ alloy layer 16b (where X may represent at least one element selected from the group consisting of Cu, Au, Ag, Zn, Mn, Al, Cd, Zr, and Hf, a may represent a composition ratio satisfying $80 < a \leq 100$, and b may represent a composition ratio satisfying $60 < b \leq 100$).

The composition ratio a represents the content of Ni in NiFe on an atomic percent basis, and the composition ratio b represents the content of NiFe in the $(Ni_aFe_{100-a})_b X_{100-b}$ alloy on an atomic percent basis.

The composition ratio of the $(Ni_aFe_{100-a})_b X_{100-b}$ alloy layer 16b to be deposited on the $Co_2MnZ$ alloy layer 16a may be specified as described above and, thereby, the magnetostriction constant λs and the coercive force Hc of the free magnetic layer may be reduced, and the soft magnetic properties of the free magnetic layer may be improved.

In particular, it may be preferable that the ratios a and b of the $(Ni_aFe_{100-a})_b X_{100-b}$ alloy layer 16b satisfy $80 < a \leq 100$ and $90 < b \leq 100$.

When the element X is added to the NiFe alloy, the spin-dependent bulk scattering coefficient β of the $(Ni_aFe_{100-a})_b X_{100-b}$ alloy may be increased, and the ΔRA of the magnetic sensing element may be increased.

When the element X is added to the NiFe alloy, the magnetic thickness (product Mst of saturation magnetization Ms and film thickness) of the $(Ni_aFe_{100-a})_b X_{100-b}$ alloy layer may decrease, and the fluctuation of the free magnetic layer 16 in response to an external magnetic field may increase. That is, the detection sensitivity of the magnetic sensing element to a magnetic field may be improved.

The film thickness t2 of the $(Ni_aFe_{100-a})_b X_{100-b}$ alloy layer 16b may be about 10 angstroms or more and about 60 angstroms or less. If the film thickness t2 of the $(Ni_aFe_{100-a})_b X_{100-b}$ alloy layer 16b exceeds about 60 angstroms, the product ΔRA of resistance variation ΔR and element area A is decreased. If the film thickness t2 is less than about 10 angstroms, the magnetostriction of the entire free magnetic layer 16 may be increased. These may not be preferable.

The film thickness of the $Co_2MnZ$ alloy layer 16a may be about 40 angstroms or more and about 80 angstroms or less. When the film thickness of the $Co_2MnZ$ alloy layer 16a is about 40 angstroms or more, the crystallinity and the periodicity of the $Co_2MnZ$ alloy layer 16a may be improved.

When the $Co_2MnZ$ alloy layer 16a is in contact with the non-magnetic material layer 15, as in the present embodiment, the ΔRA of the magnetic sensing element may be improved as compared with the case where the $(Ni_aFe_{100-a})_b X_{100-b}$ alloy layer 16b is in contact with the non-magnetic material layer 15. Therefore, a free magnetic layer having a three-layer structure, in which a $Co_2MnZ$ alloy layer is further deposited on the $(Ni_aFe_{100-a})_b X_{100-b}$ alloy layer 16b, may be formed.

As for the magnetic sensing element shown in FIG. 2, the magnetization of the pinned magnetic layer and the magnetization of the free magnetic layer may be orthogonal to each other. When a leakage magnetic field from a recording medium enters the magnetic sensing element in the Y direction shown in the drawing, the magnetization of the free magnetic layer fluctuates with high sensitivity and the electrical resistance varies depending on the relationship between the magnetization direction of the free magnetic layer and that of the pinned magnetic layer. The leakage magnetic field from the recording medium may be detected based on the change in voltage or the change in current resulting from the change in electrical resistance. In the dual spin valve type magnetic sensing element shown in FIG. 2, the pinned magnetic layer 32 and the pinned magnetic layer 31 are disposed on the top and the bottom of the free magnetic layer 16 with the non-magnetic material layers 15 therebetween. Therefore, in theory, the product ΔRA of resistance variation ΔR and element area A may be double the ΔRA of the single spin valve type magnetic sensing element shown in FIG. 1. As for the magnetic sensing element of the present embodiment, the ΔRA of the magnetic sensing element may be allowed to reach about 5 mΩμm² or more.

The $Co_2MnZ$ alloy constituting the $Co_2MnZ$ alloy layer 16a of the free magnetic layer 16 may be a Heusler alloy. The Heusler alloy is a general name of metal compounds having a Heusler type of crystal structure that exhibit ferromagnetism depending on the composition. The $Co_2MnZ$ alloy may have a large spin polarizability and exhibit half-metallic behavior in which the majority of conduction electrons are either up-spin electrons or down-spin electrons.

When the free magnetic layer 16 of the CPP-GMR magnetic sensing element includes a $Co_2MnZ$ alloy layer 16a, the magnitude of the change in spin scattering length or mean free path of conduction electrons within the free magnetic layer 16 may be increased upon application of an external magnetic field. That is, the variation in resistance of the multilayer film may be increased, and the detection sensitivity to an external magnetic field may be improved.

However, if the free magnetic layer 16 is made to have a single layer structure of the $Co_2MnZ$ alloy layer 16a, the magnetostriction constant λs and the coercive force Hc of the free magnetic layer 16 may be increased, and the fluctuation of the free magnetic layer 16 in response to an external magnetic field may be reduced. That is, the soft magnetic properties of the free magnetic layer 16 may be reduced, and the detection sensitivity of the magnetic sensing element to a magnetic field may be reduced.

Here, the magnetostriction constant λs and the coercive force Hc of the free magnetic layer 16 may be reduced by depositing the $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying 80<a≦100, and b may represent a composition ratio satisfying 60<b≦100) on the $Co_2MnZ$ alloy layer 16a, as in the present embodiment. This is because the magnetostriction constant λs of the $(Ni_aFe_{100-a})_bX_{100-b}$ alloy may be made negative and the coercive force Hc may be reduced when the composition ratios of the element Ni, the element Fe, and the element X in the $(Ni_aFe_{100-a})_bX_{100-b}$ alloy are set within the ranges described above.

Either the $Co_2MnZ$ alloy layer 16a or the $(Ni_aFe_{100-a})_bX_{100-b}$ alloy layer 16b, whichever is located on the lower side, is assumed to be a lower free magnetic layer, and the other layer located on the upper side is assumed to be an upper free magnetic layer. Either a multilayer film lower portion B, including the lower free magnetic layer as well as the non-magnetic material layer 15 and the pinned magnetic layer 31 disposed under this lower free magnetic layer, or a multilayer film upper portion A, including the upper free magnetic layer as well as the non-magnetic material layer 15 and the pinned magnetic layer 32 disposed above this upper free magnetic layer, whichever is located on the upstream side of the conduction electron flow, is assumed to be a multilayer film upstream portion, and the other portion, which is located on the downstream side of the conduction electron flow, is assumed to be a multilayer film downstream portion. Preferably, the product ΔRA of resistance variation and element area of the multilayer film upstream portion is smaller than the ΔRA of the multilayer film downstream portion.

In this manner, noise originating from the spin transfer torque (STT) may be reduced.

The spin transfer torque refers to the torque which is caused by propagation of the spin angular momentum of conduction electrons to the spin angular momentum of the magnetic material constituting the free magnetic layer and the pinned magnetic layer. This torque fluctuates the spin angular momentum of the free magnetic layer when a current flows in a direction perpendicular to the film surfaces of the multilayer film composed of the free magnetic layer, the non-magnetic material layer, and the pinned magnetic layer. If the spin angular momentum of the free magnetic layer fluctuates, noise may be superimposed on the reproduction output, thereby reducing the S/N ratio of the magnetic sensing element.

The spin transfer torque generated when conduction electrons flow in a direction from the free magnetic layer toward the pinned magnetic layer is smaller than the spin transfer torque generated when conduction electrons flow in a direction from the pinned magnetic layer toward the free magnetic layer.

When the multilayer film upstream portion of the multilayer film of the magnetic sensing element and the multilayer film downstream portion are constructed asymmetrically and, thereby, the product ΔRA of resistance variation and element area of the multilayer film upstream portion is made smaller than the ΔRA of the multilayer film downstream portion, the spin transfer torque applied to the free magnetic layer of the dual spin valve type magnetic sensing element may be adequately cancelled. The spin transfer torque applied to the free magnetic layer may be in principle reduced to zero.

In the magnetic sensing element shown in FIG. 2, the $Co_2MnZ$ alloy layer 16a is the lower free magnetic layer, and the $(Ni_aFe_{100-a})_bX_{100-b}$ alloy layer 16b is the upper free magnetic layer.

If the multilayer film upper portion A and the multilayer film lower portion B are compared, the multilayer film lower portion including the $Co_2MnZ$ alloy layer 16a may exhibit a larger ΔRA. Therefore, in the dual spin valve type magnetic sensing element shown in FIG. 2, when conduction electrons flow from the top to the bottom, the multilayer film upper portion A may be specified to be the multilayer film upstream portion and the multilayer film lower portion B may be specified to be the multilayer film downstream portion, the ΔRA of the multilayer film upstream portion becomes smaller than the ΔRA of the multilayer film downstream portion.

Figure 3:
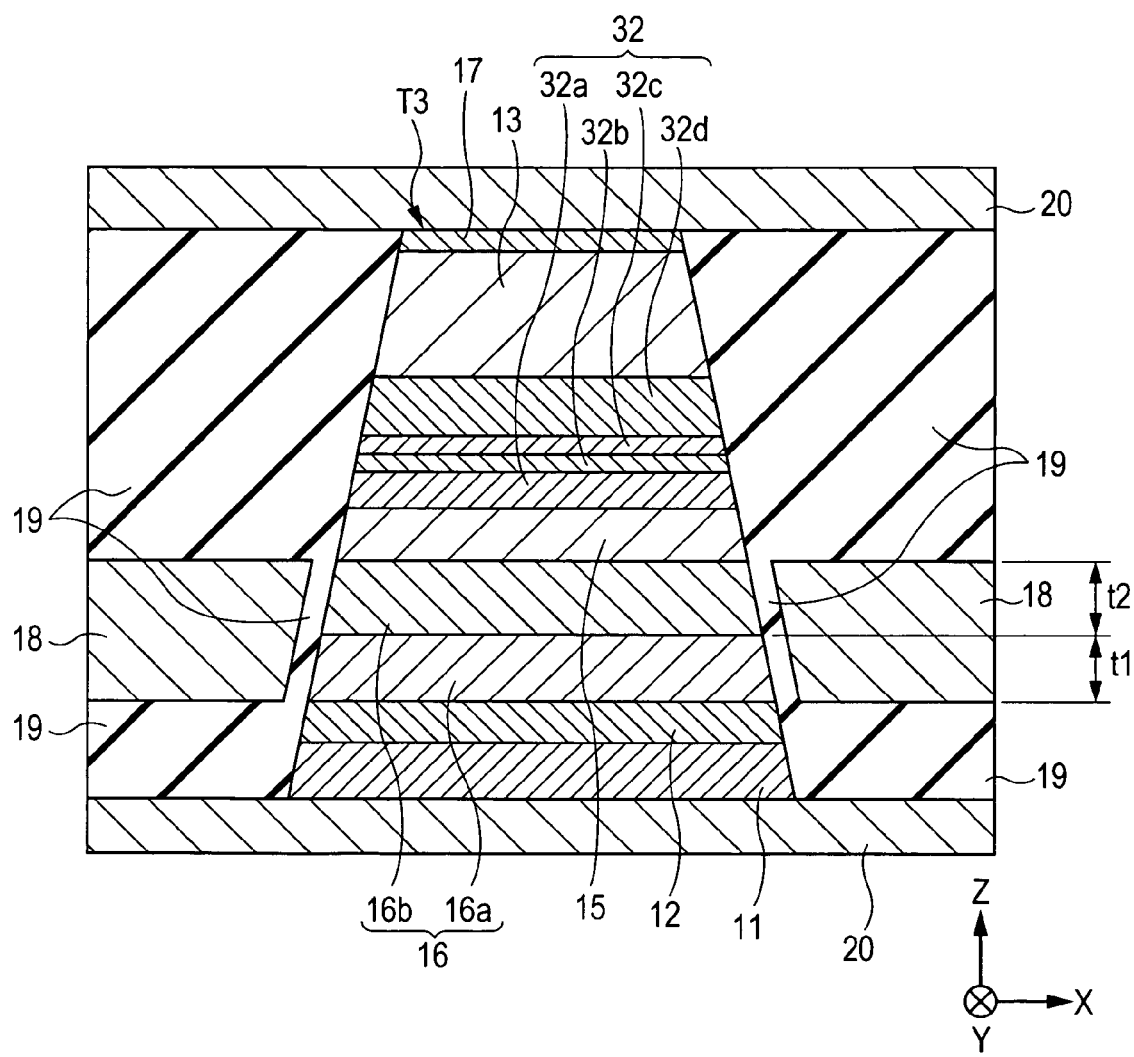
FIG. 3 is a sectional view of the structure of a magnetic sensing element (single spin valve type magnetoresistance effect element) according to a third embodiment viewed from a surface facing a recording medium.

FIG. 3 is a partial sectional view showing the structure of a top spin valve type magnetic sensing element according to the present invention.

As shown in FIG. 3, a substrate layer 11, a seed layer 12, a free magnetic layer 16, a non-magnetic material layer 15, a pinned magnetic layer 32, an antiferromagnetic layer 13, and a protective layer 17 are sequentially deposited from the bottom, so that a multilayer film T3 is disposed.

Hard bias layers 18 and 18 are disposed on both sides of the free magnetic layer 16. The hard bias layers 18 and 18 may be insulated by insulating layers 19 and 19 made of alumina or the like.

Electrode layers 20 and 20 are disposed on the top and bottom of the multilayer film T3, so that a current-perpendicular-to-the-plane (CPP)-GMR magnetic sensing element may be constructed, in which a sensing current flows in a direction perpendicular to the film surface of each layer constituting the multilayer film T3.

In FIG. 3, the layers indicated by the same reference numerals as those in FIG. 1 or FIG. 2 are formed from the same materials as the materials for the layers shown in FIG. 1 or FIG. 2.

In the present embodiment as well, the free magnetic layer 16 includes a $Co_2MnZ$ alloy layer 16a (where Z represents at least one element selected from the group consisting of Al, Sn, In, Sb, Ga, Si, Ge, Pb, and Zn) and a $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying 80<a≦100, and b may represent a composition ratio satisfying 60<b≦100). The composition ratio a represents the content of Ni in NiFe on an atomic percent basis, and the composition ratio b represents the content of NiFe in the $(Ni_aFe_{100-a})_bX_{100-b}$ alloy on an atomic percent basis.

The composition ratio of the $(Ni_aFe_{100-a})_bX_{100-b}$ alloy layer 16b to be deposited on the $Co_2MnZ$ alloy layer 16a may be specified as described above and, thereby, the magnetostriction constant λs and the coercive force Hc of the free magnetic layer may be reduced, and the soft magnetic properties of the free magnetic layer may be improved.

In particular, it may be preferable that the ratios a and b of the $(Ni_aFe_{100-a})_bX_{100-b}$ alloy layer 16b satisfy $80<a\leqq100$ and $90<b\leqq100$.

When the element X is added to the NiFe alloy, the spin-dependent bulk scattering coefficient β of the $(Ni_aFe_{100-a})_b X_{100-b}$ alloy may be increased, and the ΔRA of the magnetic sensing element may be increased.

When the element X is added to the NiFe alloy, the magnetic thickness (product Mst of saturation magnetization Ms and film thickness) of the $(Ni_aFe_{100-a})_bX_{100-b}$ alloy layer may be decreased, and fluctuation of the free magnetic layer 16 in response to an external magnetic field may be increased. That is, the detection sensitivity of the magnetic sensing element to a magnetic field may be improved.

The film thickness t2 of the $(Ni_aFe_{100-a})_bX_{100-b}$ alloy layer 16b may be about 10 angstroms or more and about 60 angstroms or less. If the film thickness t2 of the $(Ni_aFe_{100-a})_b X_{100-b}$ alloy layer 16b exceeds about 60 angstroms, the product ΔRA of resistance variation ΔR and element area A may be decreased. If the film thickness t2 is less than about 10 angstroms, the magnetostriction of the entire free magnetic layer 16 may be increased. These may not be preferable.

The film thickness of the $Co_2MnZ$ alloy layer 16a may be about 40 angstroms or more and about 80 angstroms or less. When the film thickness of the $Co_2MnZ$ alloy layer 16a is about 40 angstroms or more, the crystallinity and the periodicity of the $Co_2MnZ$ alloy layer 16a may be improved.

The magnetostriction constant λs and the coercive force Hc of the free magnetic layer 16 may be reduced by depositing the $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying $80<a\leqq100$, and b may represent a composition ratio satisfying $60<b\leqq100$) on the $Co_2MnZ$ alloy layer 16a, as in the present embodiment. This is because the magnetostriction constant λs of the $(Ni_aFe_{100-a})_bX_{100-b}$ alloy may be made negative and the coercive force Hc may be reduced when the composition ratios of the element Ni, the element Fe, and the element X in the $(Ni_aFe_{100-a})_bX_{100-b}$ alloy are set within the ranges described above.

In FIG. 1 to FIG. 3, the magnetization directions of the pinned magnetic layers 14, 31, and 32 are pinned by the exchange coupling magnetic field at the interface between the antiferromagnetic layer 13 and the pinned magnetic layers 14, 31, and 32. However, the antiferromagnetic layer 13 may not be deposited and the pinned magnetic layers may have a self-pinning structure, in which the magnetization directions of the pinned magnetic layers 14, 31, and 32 are pinned by the uniaxial anisotropy of the pinned magnetic layers 14, 31, and 32, respectively.

Figure 4:
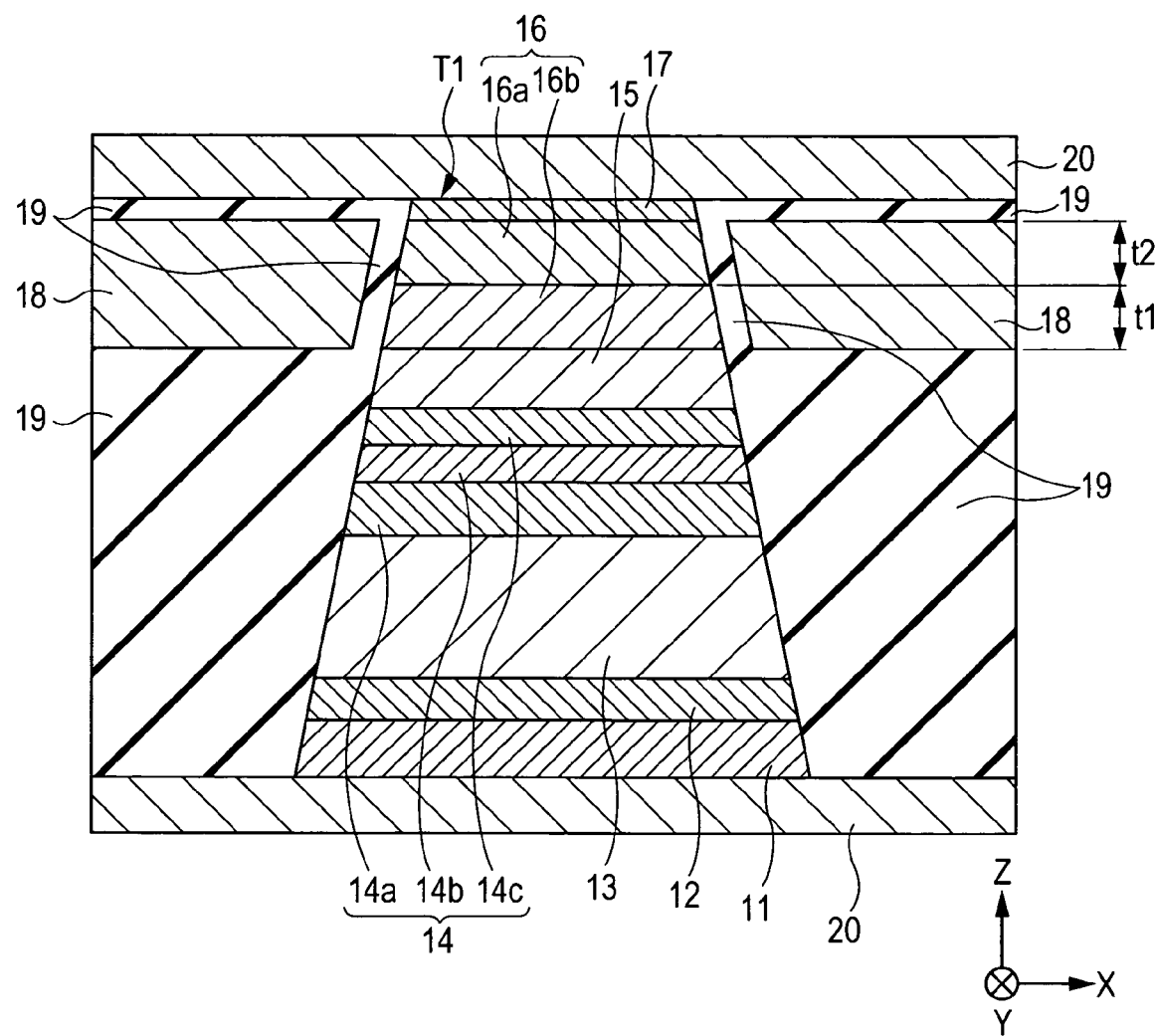
FIG. 4 is a sectional view of the structure of a magnetic sensing element (single spin valve type magnetoresistance effect element) according to a fourth embodiment viewed from a surface facing a recording medium.
Figure 5:
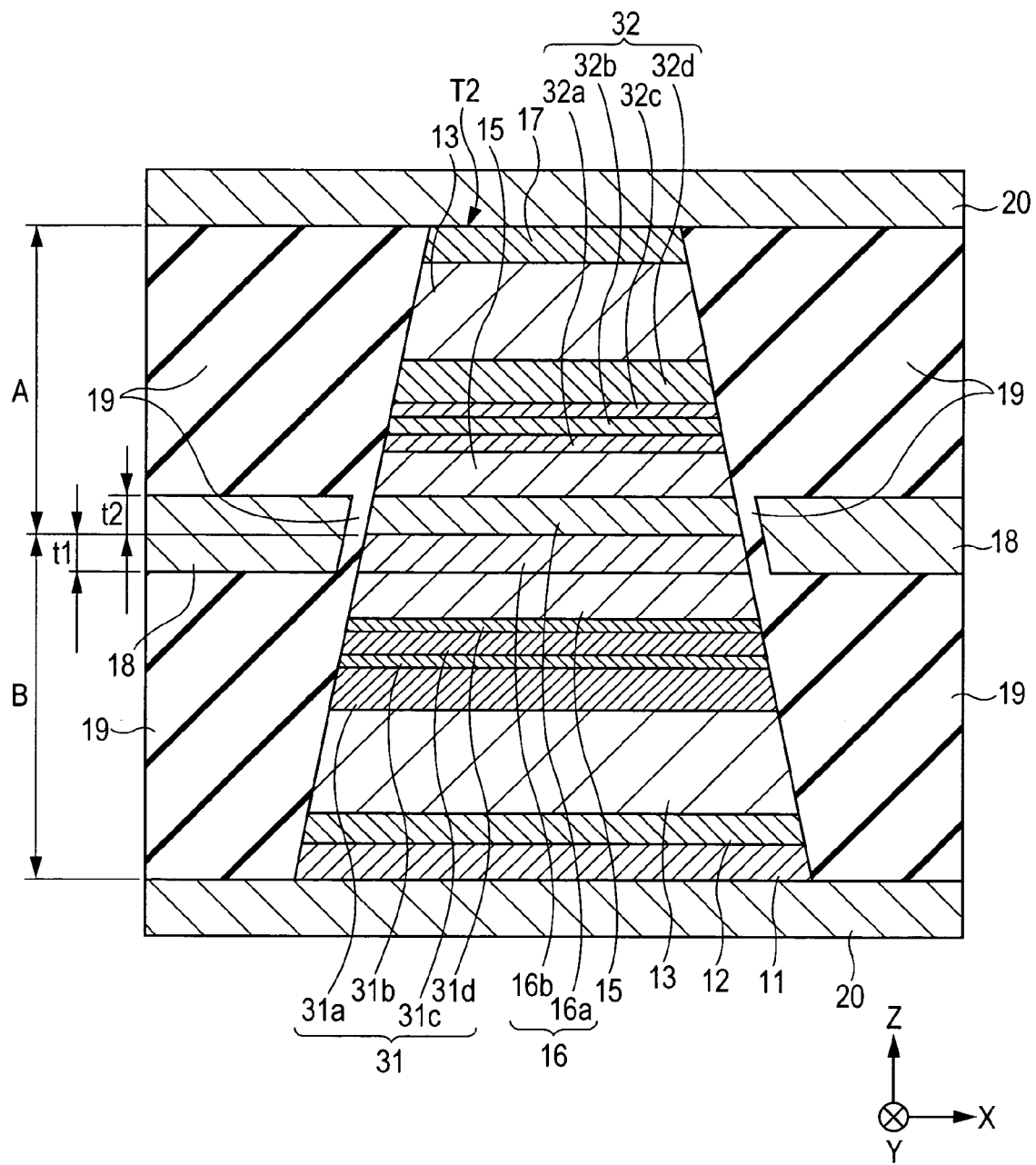
FIG. 5 is a sectional view of the structure of a magnetic sensing element (dual spin valve type magnetoresistance effect element) according to a fifth embodiment viewed from a surface facing a recording medium.
Figure 6:
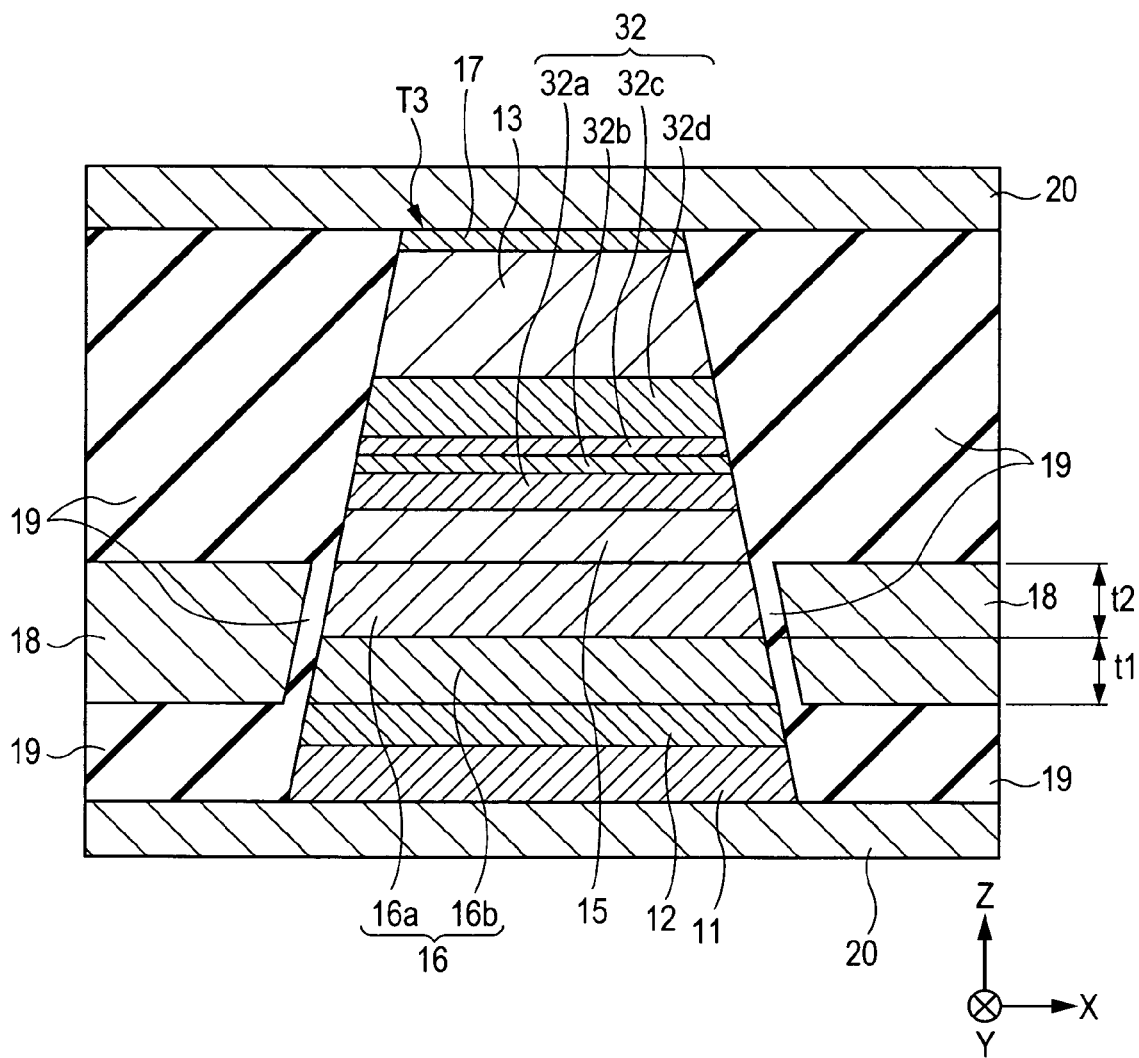
FIG. 6 is a sectional view of the structure of a magnetic sensing element (single spin valve type magnetoresistance effect element) according to a sixth embodiment viewed from a surface facing a recording medium.

FIG. 4 to FIG. 6 are sectional views showing magnetic sensing elements according to other embodiments of the present invention. The magnetic sensing elements shown in FIG. 4 to FIG. 6 are similar to the magnetic sensing elements shown in FIG. 1 to FIG. 3, respectively, but the order of deposition of the $Co_2MnZ$ alloy layer 16a and the $(Ni_aFe_{100-a})_bX_{100-b}$ alloy layer 16b are different. In each of FIG. 4 to FIG. 6, the layers indicated by the same reference numerals as those in FIG. 1 to FIG. 3 are formed from the same materials as the materials for the layers shown in FIG. 1 to FIG. 3.

In the free magnetic layer 16 of the magnetic sensing elements shown in FIG. 1 and FIG. 2, the $(Ni_aFe_{100-a})_bX_{100-b}$ alloy layer 16b is deposited on the $Co_2MnZ$ alloy layer 16a.

Here, as shown in FIG. 4 and FIG. 5, the $Co_2MnZ$ alloy layer 16a is deposited on the $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying $80<a\leqq100$, and b may represent a composition ratio satisfying $60<b\leqq100$) and the magnetostriction constant λs and the coercive force Hc of the free magnetic layer 16 thereby may be reduced.

Likewise, the order of deposition of the $Co_2MnZ$ alloy layer 16a and the $(Ni_aFe_{100-a})_bX_{100-b}$ alloy layer 16b of the free magnetic layer 16 of the magnetic sensing element shown in FIG. 3 may be changed. That is, as shown in FIG. 6, in the case where the $Co_2MnZ$ alloy layer 16a is deposited on the $(Ni_aFe_{100-a})_bX_{100-b}$ alloy layer 16b (where X may represent at least one element selected from the group consisting of Cu, Au, Ag, Zn, Mn, Al, Cd, Zr, and Hf, a may represent a composition ratio satisfying $80<a\leqq100$, and b may represent a composition ratio satisfying $60<b\leqq100$), the magnetostriction constant λs and the coercive force Hc of the free magnetic layer 16 may be reduced.

In the magnetic sensing elements according to the embodiments shown in FIG. 1 to FIG. 6, the free magnetic layers 16 have two-layer structures composed of the $Co_2MnZ$ alloy layer 16a and the $(Ni_aFe_{100-a})_bX_{100-b}$ alloy layer 16b. However, the configuration of the free magnetic layer 16 of the present invention is not limited to these two-layer structures.

Figure 7:
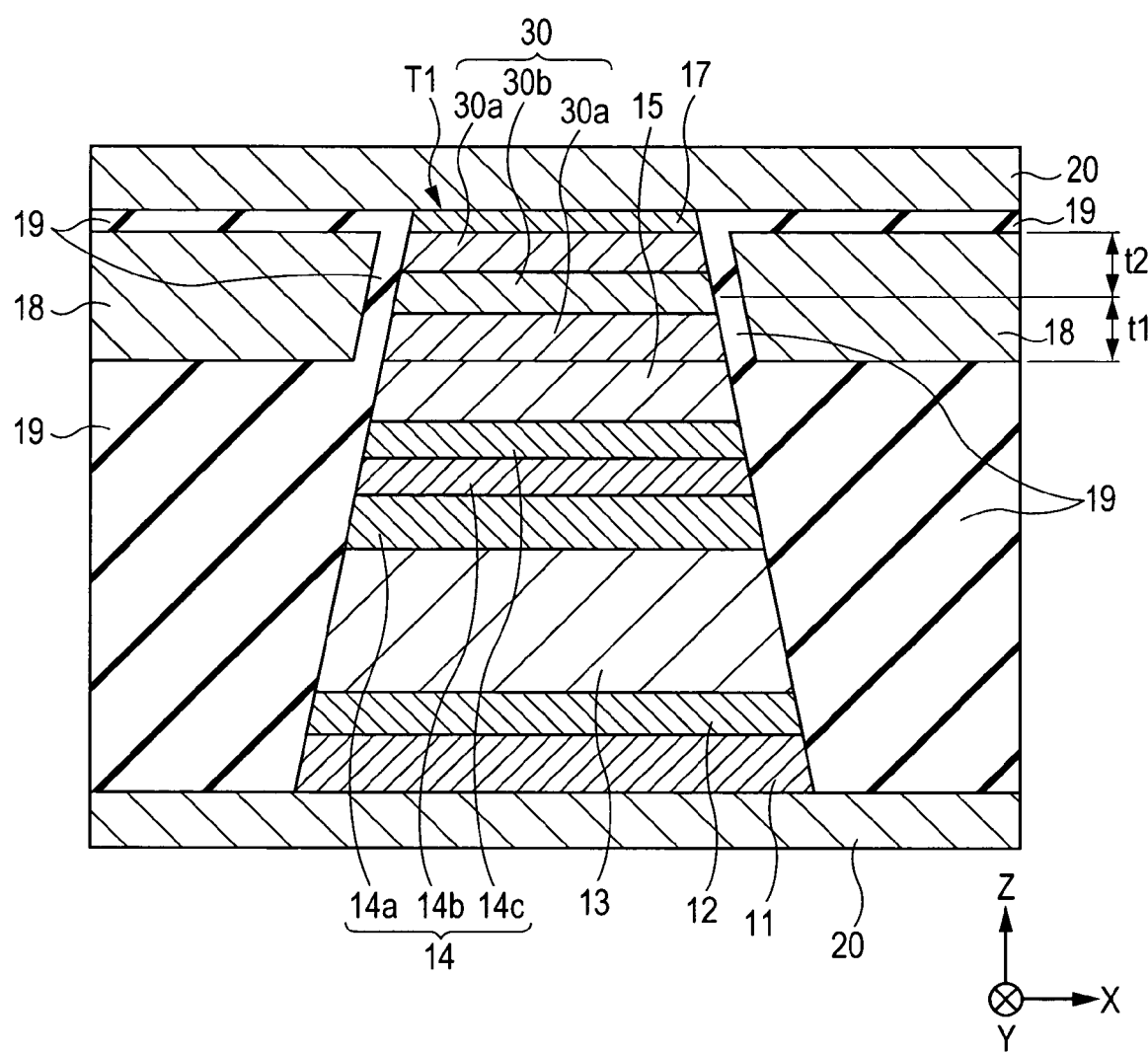
FIG. 7 is a sectional view of the structure of a magnetic sensing element (single spin valve type magnetoresistance effect element) according to a seventh embodiment viewed from a surface facing a recording medium.
Figure 8:
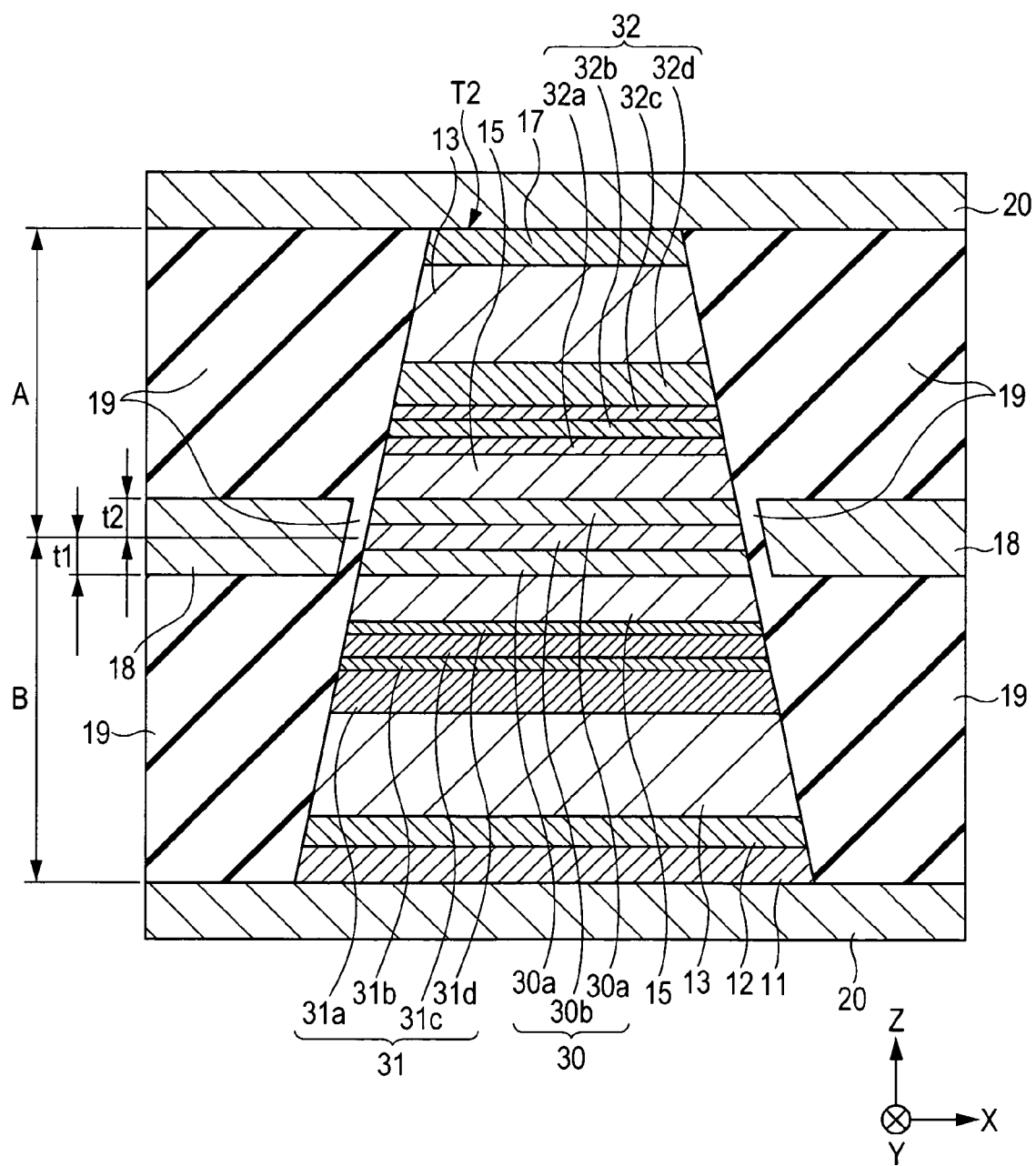
FIG. 8 is a sectional view of the structure of a magnetic sensing element (dual spin valve type magnetoresistance effect element) according to an eighth embodiment viewed from a surface facing a recording medium.
Figure 9:
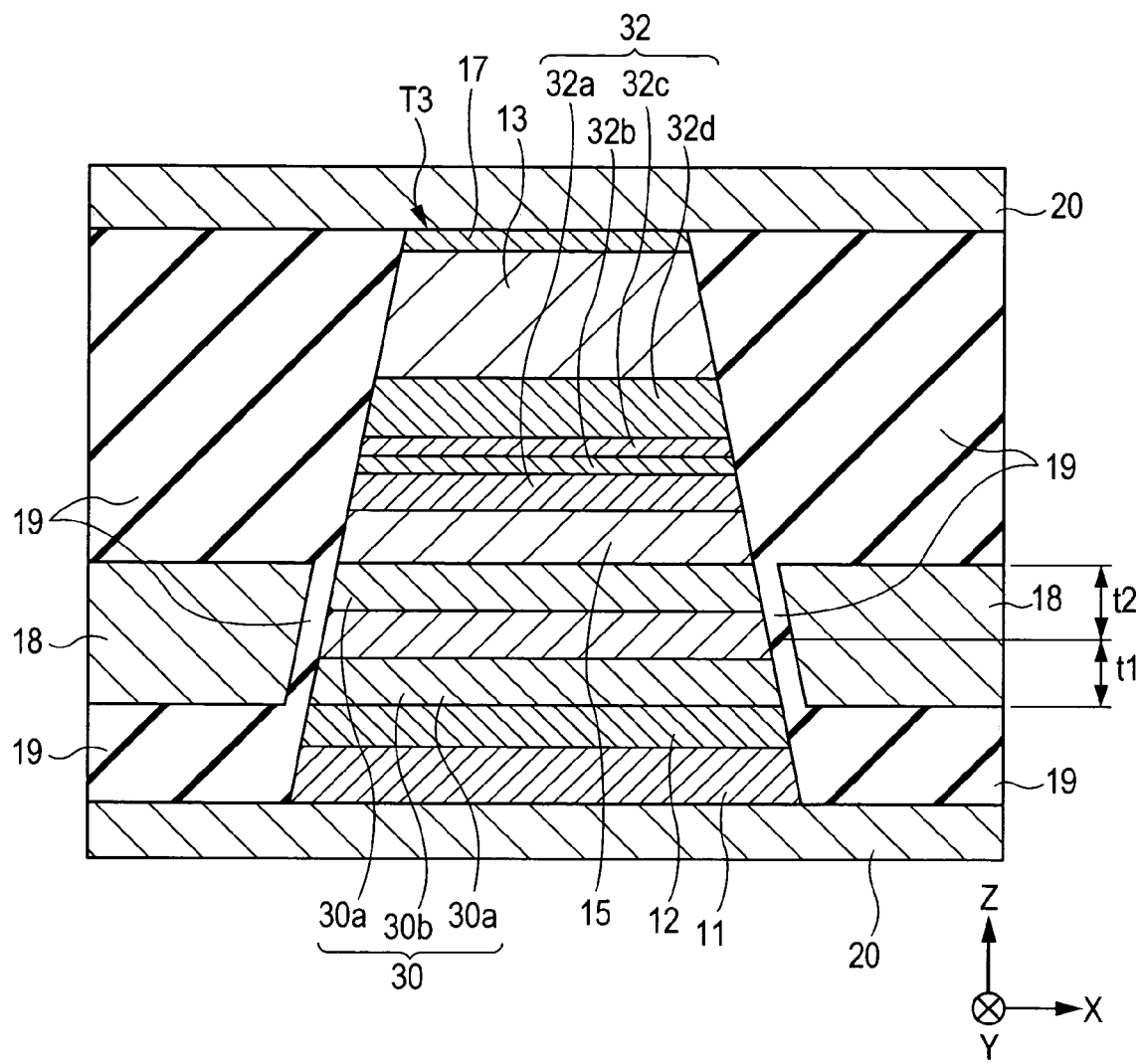
FIG. 9 is a sectional view of the structure of a magnetic sensing element (single spin valve type magnetoresistance effect element) according to a ninth embodiment viewed from a surface facing a recording medium.
Figure 10:
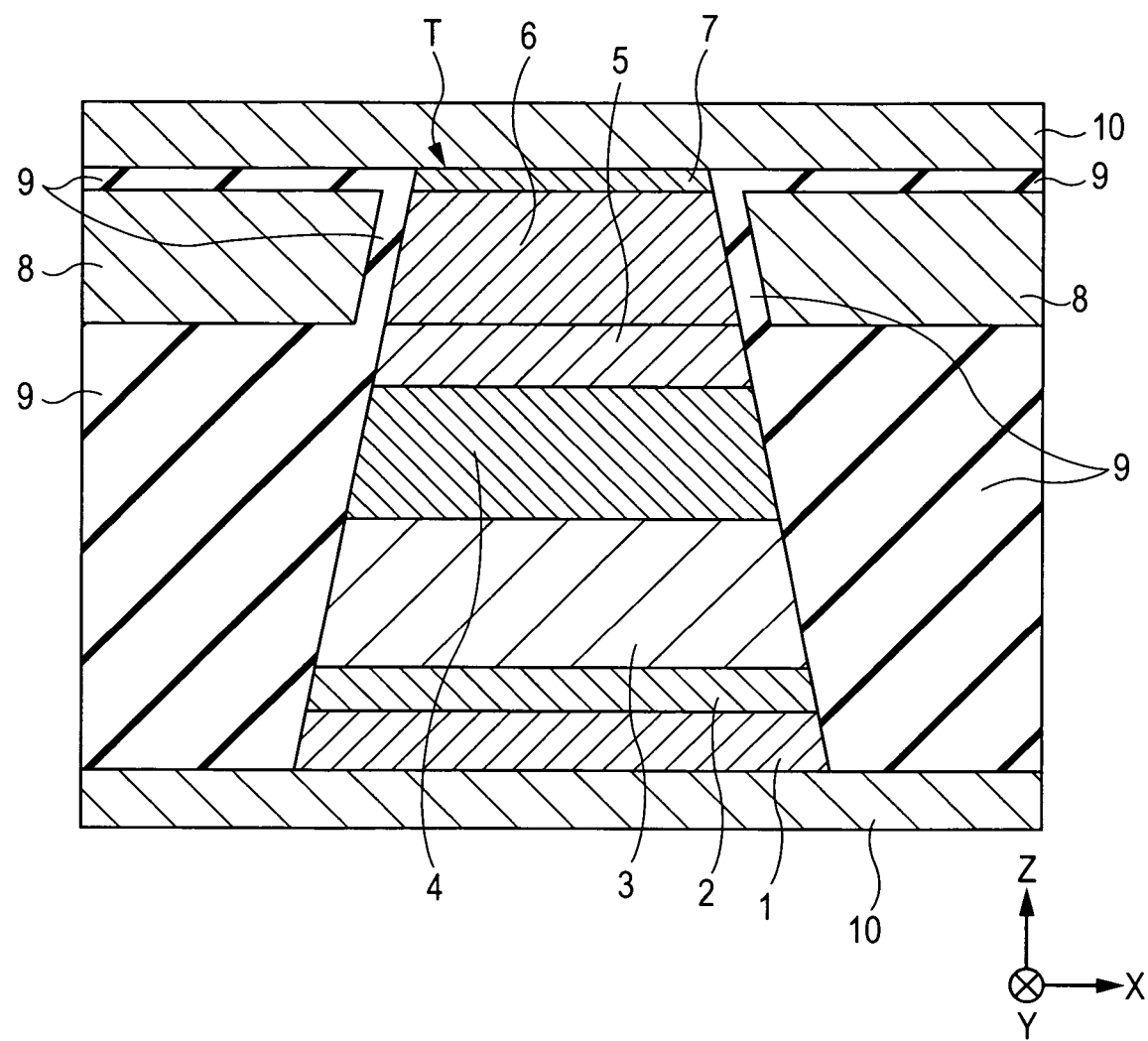
FIG. 10 is a sectional view of a known magnetic sensing element.

For example, as shown in FIG. 7 to FIG. 9, a free magnetic layer 30 may have a three-layer structure in which a $Co_2MnZ$ alloy layer 30a, a $(Ni_aFe_{100-a})_bX_{100-b}$ alloy layer 30b, and a $Co_2MnZ$ alloy layer 30a are deposited sequentially.

The magnetic sensing elements shown in FIG. 7 to FIG. 9 are similar to the magnetic sensing elements shown in FIG. 1 to FIG. 3, respectively; however, the magnetic sensing elements shown in FIG. 7 to FIG. 9 differ from the magnetic sensing elements shown in FIG. 1 to FIG. 3 in terms of the structure of the free magnetic layer 30. That is, the free magnetic layer 30 may have a three-layer structure in which the $(Ni_aFe_{100-a})_bX_{100-b}$ alloy layer 30b (where X may represent at least one element selected from the group consisting of Cu, Au, Ag, Zn, Mn, Al, Cd, Zr, and Hf, a may represent a composition ratio satisfying $80<a\leqq100$, and b may represent a composition ratio satisfying $60<b\leqq100$) is interposed between the $Co_2MnZ$ alloy layer 30a and the $Co_2MnZ$ alloy layer 30a.

In particular, in the dual spin valve type GMR magnetic sensing element shown in FIG. 8, the $Co_2MnZ$ alloy layers 30a disposed at the top and bottom of the free magnetic layer 30 are in contact with the non-magnetic material layers 15 made of Cu. The spin-dependent bulk scattering coefficient γ of conduction electrons at the interface between the $Co_2MnZ$ alloy layer 30a and the non-magnetic material layer 15 may be increased as compared with that in the case where the $(Ni_aFe_{100-a})_bX_{100-b}$ alloy layer and the non-magnetic material layer are in contact with each other. Therefore, the product ΔRA of resistance variation ΔR and element area A of the magnetic sensing element may be increased. Since the $(Ni_aFe_{100-a})_bX_{100-b}$ alloy layer 30b is disposed in the inside of the free magnetic layer 30, the magnetostriction constant λs and the coercive force Hc of the free magnetic layer 30 may be reduced. In order to increase the product ΔRA of resistance variation ΔR and element area A of the magnetic sensing element, it may be preferable that the film thickness of the $(Ni_aFe_{100-a})_bX_{100-b}$ alloy layer 30b is about 10 angstroms or more and about 30 angstroms or less.

EXAMPLE 1

Seventeen dual spin valve type magnetic sensing elements were formed with different free magnetic layer configurations. Subsequently, the product ΔRA of magnetoresistance variation ΔR and element area A of each magnetic sensing element and also the coercive force Hc and the magnetostriction constant λs of the free magnetic layer were examined.

The configuration of the second pinned magnetic layer and the free magnetic layer, the product ΔRA of magnetoresistance variation ΔR and element area A of the magnetic sensing element, and the coercive force Hc and the magnetostriction constant λs of the free magnetic layer are shown in Table 1.

TABLE 1

| | Second pinned magnetic layer (Å) | Free magnetic layer (Å) | Coercive force Hc of free magnetic layer (A/m) | Magnetostriction constant λs of free magnetic layer (ppm) | ΔRA (mΩμm$^2$) |
|---|---|---|---|---|---|
| Comparative example 1 | $Co_{90}Fe_{10}$(50) | $Ni_{80}Fe_{20}$(80) | 12 | 0.2 | 2.5 |
| Comparative example 2 | $Co_{90}Fe_{10}$(10)/$Co_2MnGe$(40) | $Co_2MnGe$(80) | 1080 | 25.5 | 9.4 |
| Comparative example 3 | $Co_{90}Fe_{10}$(10)/$Co_2MnGe$(40) | $Ni_{80}Fe_{20}$(80) | 12 | 0.2 | 4.5 |
| Comparative example 4 | $Co_{90}Fe_{10}$(10)/$Co_2MnGe$(40) | $Co_2MnGe$(40)/$Ni_{80}Fe_{20}$(40) | 280 | 13.5 | 5.5 |
| Comparative example 5 | $Co_{90}Fe_{10}$(10)/$Co_2MnGe$(40) | $Co_2MnGe$(40)/$Co_{85}Fe_{15}$(40) | 1640 | 0.5 | 4.8 |
| Example 1 | $Co_{90}Fe_{10}$(10)/$Co_2MnGe$(40) | $Co_2MnGe$(40)/$Ni_{85}Fe_{15}$(40) | 450 | 3.5 | 5.5 |
| Example 2 | $Co_{90}Fe_{10}$(10)/$Co_2MnGe$(40) | $Co_2MnGe$(40)/$Ni_{90}Fe_{10}$(40) | 864 | 2.2 | 5.6 |
| Example 3 | $Co_{90}Fe_{10}$(10)/$Co_2MnGe$(40) | $Co_2MnGe$(40)/$Ni_{95}Fe_5$(40) | 875 | 0.9 | 5.8 |
| Example 4 | $Co_{90}Fe_{10}$(10)/$Co_2MnGe$(40) | $Co_2MnGe$(40)/Ni(40) | 883 | 0.3 | 5.6 |
| Example 5 | $Co_{90}Fe_{10}$(10)/$Co_2MnGe$(40) | $Co_2MnGe$(40)/$(Ni_{90}Fe_{10})_{95}Cu_5$(40) | 230 | 0.6 | 6.2 |
| Example 6 | $Co_{90}Fe_{10}$(10)/$Co_2MnGe$(40) | $Co_2MnGe$(40)/$(Ni_{90}Fe_{10})_{90}Cu_{10}$(40) | 290 | 0.3 | 5.8 |
| Example 7 | $Co_{90}Fe_{10}$(10)/$Co_2MnGe$(40) | $Ni_{95}Fe_5$(40)/$Co_2MnGe$(40) | 380 | 0.8 | 5.7 |
| Example 8 | $Co_{90}Fe_{10}$(10)/$Co_2MnGe$(40) | Ni(40)/$Co_2MnGe$(40) | 450 | 0.1 | 5.5 |
| Example 9 | $Co_{90}Fe_{10}$(10)/$Co_2MnGe$(40) | $Co_2MnGe$(40)/$Ni_{95}Fe_5$(30) | 880 | 2.5 | 6.5 |
| Example 10 | $Co_{90}Fe_{10}$(10)/$Co_2MnGe$(40) | $Co_2MnGe$(40)/$Ni_{95}Fe_5$(50) | 786 | −0.4 | 5.3 |
| Example 11 | $Co_{90}Fe_{10}$(10)/$Co_2MnGe$(40) | $Co_2MnGe$(40)/Ni(30) | 890 | 1.4 | 6.3 |
| Example 12 | $Co_{90}Fe_{10}$(10)/$Co_2MnGe$(40) | $Co_2MnGe$(40)/Ni(50) | 779 | −0.8 | 5.2 |
| Example 13 | $Co_{90}Fe_{10}$(10)/$Co_2MnGe$(40) | $Co_2MnGe$(40)/Ni(20)/$Co_2MnGe$(40) | 980 | 6.4 | 7.0 |
| Example 14 | $Co_{90}Fe_{10}$(10)/$Co_2MnGe$(40) | $Co_2MnGe$(40)/Ni(40)/$Co_2MnGe$(40) | 850 | 2.7 | 6.9 |
| Example 15 | $Co_{90}Fe_{10}$(10)/$Co_2MnGe$(40) | $Co_2MnGe$(40)/Ni(60)/$Co_2MnGe$(40) | 880 | −0.5 | 6.6 |

The film configuration of the dual spin valve type magnetic sensing element used in the experiment is shown below. Each number in parentheses represents a film thickness.

Substrate/Ta substrate layer (30 angstroms)/NiFeCr seed layer (50 angstroms)/PtMn antiferromagnetic layer (120 angstroms)/pinned magnetic layer ($Co_{70}Fe_{30}$ first pinned magnetic layer/Ru non-magnetic intermediate layer (8 angstroms)/second pinned magnetic layer (50 angstroms))/Cu non-magnetic material layer (43 angstroms)/free magnetic layer (70 to 90 angstroms)/Cu non-magnetic material layer (43 angstroms)/pinned magnetic layer (second pinned magnetic layer (50 angstroms)/Ru non-magnetic intermediate layer (8 angstroms)/$Co_{70}Fe_{30}$ first pinned magnetic layer)/PtMn antiferromagnetic layer (120 angstroms)/Ta protective layer (30 angstroms)

An accurate composition ratio of the $Co_2MnGe$ alloy is $Co_{49}Mn_{26}Ge_{25}$.

When the free magnetic layer has a single-layer structure composed of the $Co_2MnGe$ alloy, as in Comparative example 2, the magnetic sensing element has large ΔRA of 9.4 mΩμm$^2$. However, the coercive force Hc of the free magnetic layer exceeds 1,000 A/m and the magnetostriction constant λs becomes 25 ppm. Therefore, the stability of the magnetic sensing element may not be satisfactory.

When the free magnetic layer has a single-layer structure composed of the $Ni_{80}Fe_{20}$ alloy as in Comparative example 3, each of the coercive force Hc and the magnetostriction constant λs of the free magnetic layer is reduced. However, the ΔRA of the magnetic sensing element is 4.5 mΩμm$^2$, which is less than the desired value of 5.0 mΩμm$^2$.

The magnetic sensing element of Comparative example 4, in which the free magnetic layer is a laminate of the $Co_2MnGe$ alloy layer and the $Ni_{80}Fe_{20}$ alloy layer, has $\Delta RA$ of 5.5 m$\Omega\mu m^2$. However, the free magnetic layer has a magnetostriction constant $\lambda s$ of 13.5 ppm, which is undesirably high.

The magnetic sensing element of Comparative example 5, in which the free magnetic layer is a laminate of the $Co_2MnGe$ alloy layer and the $Co_{85}Fe_{15}$ alloy layer, has a coercive force exceeding 1,600 A/m, and therefore the magnetic sensing element may not be used in practice.

On the other hand, the magnetic sensing element of Example 1, in which the free magnetic layer is a laminate of the $Co_2MnGe$ alloy layer and the $Ni_{85}Fe_{15}$ alloy layer, has a very small magnetostriction constant $\lambda s$ of 3.5 ppm, and therefore the magnetic sensing element may have practical stability.

The magnetic sensing element of Example 2, in which the free magnetic layer is a laminate of the $Co_2MnGe$ alloy layer and the $Ni_{90}Fe_{10}$ alloy layer, has a magnetostriction constant $\lambda s$ of 2.2 ppm. The coercive force Hc is 864 A/m.

The magnetic sensing element of Example 3, in which the free magnetic layer is a laminate of the $Co_2MnGe$ alloy layer and the $Ni_{95}Fe_5$ alloy layer, and the magnetic sensing element of Example 4, in which the free magnetic layer is a laminate of the $Co_2MnGe$ alloy layer and the Ni layer, have magnetostriction constants $\lambda s$ of 0.9 ppm and 0.3 ppm, respectively. The coercive forces Hc are 875 A/m and 883 A/m, respectively. The Ni layer refers to a layer made of Ni alone.

Each of the magnetic sensing elements of Example 1 to Example 4 also has $\Delta RA$ of 5.5 m$\Omega\mu m^2$ or more.

In Examples 5 and 6, each free magnetic layer is a laminate of the $Co_2MnGe$ alloy layer and the NiFeCu alloy layer. Both the free magnetic layer of Example 5 and the free magnetic layer of Example 6 have adequately small magnetostriction constants $\lambda s$ of 1 ppm or less, and adequately small coercive forces Hc of 300 A/m or less.

A layer including the NiFeCu alloy, in which Cu is added to the NiFe alloy, has a larger spin-dependent bulk scattering coefficient $\beta$ and a smaller magnetic thickness (product Mst of saturation magnetization Ms and film thickness) as compared with those of the NiFe alloy containing no Cu. As a result, each of the magnetic sensing elements of Examples 5 and 6 has $\Delta RA$ larger than those of the magnetic sensing elements of Examples 1 to 4.

When the free magnetic layer is composed of the laminate of the $Co_2MnGe$ alloy layer and the NiFe or NiFeCu alloy layer, the magnetostriction constant $\lambda s$ of the free magnetic layer may be reduced. This is because the magnetostriction constant $\lambda s$ of the $Co_2MnGe$ alloy layer has a positive value and the magnetostriction constant $\lambda s$ of the NiFe alloy layer or the NiFeCu alloy layer has a negative value.

However, a magnetic sensing element having a low coercive force Hc and a high $\Delta RA$ may not be formed simply by depositing an alloy layer having a negative magnetostriction constant on the $Co_2MnGe$ layer, which has a positive magnetostriction constant. For example, in Comparative example 5 including the free magnetic layer in which the $Co_{85}Fe_{15}$ alloy layer exhibiting negative magnetostriction is deposited on the $Co_2MnGe$ alloy layer, the coercive force Hc of the free magnetic layer is 1,640 A/m, exceeding the range suitable for the practical use.

When the content of Ni in the NiFe alloy is increased to more than 80 atomic percent, as in Examples 1 to 4, or the content of Ni in NiFe in the NiFeCu alloy is increased to more than 80 atomic percent, as in Examples 5 and 6, the magnetostriction constant $\lambda s$ of the free magnetic layer is reduced and, in addition, the coercive force Hc is reduced to 900 A/m or less, so that the magnetic sensing element having $\Delta RA$ of 5 m$\Omega\mu m^2$ or more may be produced.

Furthermore, it may be more preferable that the composition ratio a of the $(Ni_aFe_{100-a})_bX_{100-b}$ alloy layer (where X may represent at least one element selected from the group consisting of Cu, Au, Ag, Zn, Mn, Al, Cd, Zr, and Hf) satisfies $85 \leq a \leq 100$.

In Examples 1 to 6, the NiFe alloy layer, the NiFeCu alloy layer, or the Ni layer is deposited on the $Co_2MnGe$ alloy layer. However, even when the order of deposition of the $Co_2MnGe$ alloy layer and the NiFe alloy layer or the Ni layer is changed, the effect of reducing the magnetostriction of the free magnetic layer is maintained.

In the free magnetic layer of Example 7, the $Co_2MnGe$ alloy layer is deposited on the $Ni_{95}Fe_5$ alloy layer, and in the free magnetic layer of Example 8, the $Co_2MnGe$ alloy layer is deposited on the Ni layer. As for the magnetic sensing elements of Examples 7 and 8, the magnetostriction constants $\lambda s$ are 0.8 ppm and 0.1 ppm, respectively, and the coercive forces Hc are 380 A/m and 450 A/m, respectively.

The magnetic sensing elements of Examples 7 and 8 have $\Delta RA$ of 5.5 m$\Omega\mu m^2$ or more.

In Examples 9 and 10, the film thickness of the $Ni_{95}Fe_5$ alloy layer of the magnetic sensing element of Example 3 is changed to 30 angstroms and 50 angstroms, respectively.

In Examples 11 and 12, the film thickness of the Ni layer of the magnetic sensing element of Example 4 is changed to 30 angstroms and 50 angstroms, respectively.

As is clear from the results of Examples 9 to 12, the value of $\Delta RA$ tends to increase as the film thickness of the $Ni_{95}Fe_5$ alloy layer or the Ni layer is decreased. However, as for each of the magnetic sensing elements of Examples 9 to 12, the $\Delta RA$ is 5.0 m$\Omega\mu m^2$ or more, and the magnetostriction constant $\lambda s$ is adequately small.

In Examples 13 to 15, the free magnetic layer has a three-layer structure in which the Ni layer is interposed between the two $Co_2MnGe$ alloy layers facing each other in a vertical direction.

In Example 13, the Ni layer having a film thickness of 20 angstroms is interposed between the two $Co_2MnGe$ alloy layers. The magnetostriction constant $\lambda s$ is 6.4 ppm. The coercive force Hc is 980 A/m. Furthermore, $\Delta RA$ is 7.0 m$\Omega\mu m^2$ which is a very large value.

IN Example 14, the Ni layer having a film thickness of 40 angstroms is interposed between the two $Co_2MnGe$ alloy layers, and in Example 15, the Ni layer having a film thickness of 60 angstroms is interposed between the two $Co_2MnGe$ alloy layers.

The magnetostriction constant $\lambda s$ is 2.7 ppm in Example 14, and the magnetostriction constant $\lambda s$ is -0.5 ppm in Example 15. Both values are adequately small. The coercive force Hc is 850 A/m in Example 14, and the coercive force Hc is 880 A/m in Example 15. Furthermore, $\Delta RA$ is 6.9 m$\Omega\mu m^2$ in Example 14, and $\Delta RA$ is 6.6 m$\Omega\mu m^2$ in Example 15. Both values are very large.

As is clear from the results of Examples 13 to 15, the value of $\Delta RA$ tends to increase as the film thickness of the Ni layer interposed between the two $Co_2MnGe$ alloy layers is decreased. However, as for each of the magnetic sensing elements of Examples 13 to 15, the $\Delta RA$ is 6.6 m$\Omega\mu m^2$ or more, which is a large value, and the magnetostriction constant $\lambda s$ is adequately small.

What is claimed is:

1. A magnetic sensing element comprising a multilayer film including a pinned magnetic layer, a free magnetic layer, and a non-magnetic material layer disposed therebetween, wherein the free magnetic layer comprises a $Co_2MnZ$ alloy layer (where Z represents at least one element selected from the group consisting of Al, Sn, In, Sb, Ga, Si, Ge, Pb, and Zn) and a $(Ni_aFe_{100-a})_bX_{100-b}$ alloy layer (where X represents at least one element selected from the group consisting of Cu, Au, Ag, Zn, Mn, Al, Cd, Zr, and Hf, and a represents a composition ratio satisfying $80<a\leqq100$ in terms of atomic percent and b represents a composition ratio satisfying $60<b\leqq100$ in terms of atomic percent).

2. The magnetic sensing element according to claim 1, wherein b represents a composition ratio satisfying $90<b\leqq100$ in terms of atomic percent.

3. The magnetic sensing element according to claim 1, wherein a represents a composition ratio satisfying $81.5<a\leqq100$ in terms of atomic percent.

4. The magnetic sensing element according to claim 3, wherein a represents a composition ratio satisfying $81.5<a\leqq100$ in terms of atomic percent and b represents a composition ratio satisfying $90<b\leqq100$ in terms of atomic percent.

5. The magnetic sensing element according to claim 1, wherein the $(Ni_aFe_{100-a})_bX_{100-b}$ alloy layer has a film thickness of about 10 angstroms or more and about 60 angstroms or less.

6. The magnetic sensing element according to claim 5, wherein the $(Ni_aFe_{100-a})_bX_{100-b}$ alloy layer has a film thickness of about 40 angstroms or more and about 60 angstroms or less.

7. The magnetic sensing element according to claim 1, wherein the $Co_2MnZ$ alloy layer has a film thickness of about 40 angstroms or more and about 80 angstroms or less.

8. The magnetic sensing element according to claim 1, wherein the $Co_2MnZ$ alloy layer has a superlattice structure.

9. The magnetic sensing element according to claim 1, wherein the $Co_2MnZ$ alloy layer is in contact with the non-magnetic material layer.

10. The magnetic sensing element according to claim 1, wherein the $Co_2MnZ$ alloy layer is disposed on the $(Ni_aFe_{100-a})_bX_{100-b}$ alloy layer.

11. The magnetic sensing element according to claim 1, wherein the $(Ni_aFe_{100-a})_bX_{100-b}$ alloy layer is disposed on the $Co_2MnZ$ alloy layer.

12. The magnetic sensing element according to claim 1, wherein the free magnetic layer further comprises a third layer.

13. The magnetic sensing element according to claim 1, wherein the pinned magnetic layer comprises a $Co_2YZ$ alloy layer (where Y represents at least one element selected from the group consisting of Mn, Fe, and Cr, and Z represents at least one element selected from the group consisting of Al, Ga, Si, Ge, Sn, In, Sb, Pb, and Zn).

14. The magnetic sensing element according to claim 1, wherein a product $\Delta RA$ of a resistance variation and an element area is 5 $m\Omega\mu m^2$ or more.

15. The magnetic sensing element according to claim 1, wherein the pinned magnetic layer is disposed above the free magnetic layer.

16. The magnetic sensing element according to claim 1, wherein the pinned magnetic layer is disposed below the free magnetic layer.

17. The magnetic sensing element according to claim 1, wherein the non-magnetic material layer and the pinned magnetic layer are disposed under the free magnetic layer, and an upper non-magnetic material layer and an upper pinned magnetic layer are disposed above the free magnetic layer.

18. The magnetic sensing element according to claim 17, wherein the free magnetic layer comprises an upper free magnetic layer and a lower free magnetic layer laminated directly or with another magnetic material layer or a non-magnetic material layer therebetween, and
wherein either a multilayer film lower portion, including the lower free magnetic layer as well as the non-magnetic material layer and the pinned magnetic layer disposed under the lower free magnetic layer, or a multilayer film upper portion, including the upper free magnetic layer as well as the upper non-magnetic material layer and the upper pinned magnetic layer disposed above the upper free magnetic layer, whichever is located on the upstream side of the conduction electron flow, is assumed to be a multilayer film upstream portion, and the other portion, which is located on the downstream side of the conduction electron flow, is assumed to be a multilayer film downstream portion; and
a product $\Delta RA$ of a resistance variation and an element area of the multilayer film upstream portion is smaller than the product $\Delta RA$ of the multilayer film downstream portion.

19. The magnetic sensing element according to claim 1, wherein a current flows in a direction perpendicular to a film surface of each layer of the multilayer film.

* * * * *